United States Patent
Chen et al.

(10) Patent No.: US 11,282,767 B2
(45) Date of Patent: Mar. 22, 2022

(54) SEMICONDUCTOR PACKAGE STRUCTURE AND ELECTRONIC DEVICE

(71) Applicant: Advanced Semiconductor Engineering, Inc., Kaohsiung (TW)

(72) Inventors: Hsin-En Chen, Kaohsiung (TW); Ian Hu, Kaohsiung (TW); Jung-Che Tsai, Kaohsiung (TW)

(73) Assignee: ADVANCED SEMICONDUTOR ENGINEERING, INC., Kaohsiung (TW)

( * ) Notice: Subject to any disclaimer, the term of this patent is extended or adjusted under 35 U.S.C. 154(b) by 20 days.

(21) Appl. No.: 16/717,929

(22) Filed: Dec. 17, 2019

(65) Prior Publication Data

US 2020/0266123 A1 Aug. 20, 2020

Related U.S. Application Data

(60) Provisional application No. 62/806,563, filed on Feb. 15, 2019.

(51) Int. Cl.
| | |
|---|---|
| *H01L 23/427* | (2006.01) |
| *H01L 23/46* | (2006.01) |
| *H01L 23/48* | (2006.01) |
| *H01L 23/40* | (2006.01) |

(52) U.S. Cl.
CPC ............ *H01L 23/427* (2013.01); *H01L 23/46* (2013.01); *H01L 23/481* (2013.01); *H01L 2023/4068* (2013.01)

(58) Field of Classification Search
CPC ..... H01L 23/427; H01L 23/46; H01L 23/481; H01L 2023/4068
See application file for complete search history.

(56) References Cited

U.S. PATENT DOCUMENTS

| | | | | |
|---|---|---|---|---|
| 3,794,886 | A * | 2/1974 | Goldman | H01L 23/473 361/689 |
| 4,150,421 | A * | 4/1979 | Nishihara | H05K 1/0287 174/254 |
| 9,721,868 | B2 | 8/2017 | Lin et al. | |
| 2006/0034052 | A1* | 2/2006 | Chang | H05K 1/0272 361/697 |
| 2011/0002102 | A1* | 1/2011 | Brok | H01L 23/467 361/701 |
| 2014/0362552 | A1* | 12/2014 | Murayama | H05K 1/0203 361/783 |
| 2018/0160523 | A1* | 6/2018 | Kim | H05K 1/117 |

* cited by examiner

*Primary Examiner* — Peniel M Gumedzoe
(74) *Attorney, Agent, or Firm* — Foley & Lardner LLP

(57) ABSTRACT

A semiconductor package structure includes a package substrate and a semiconductor die. The package substrate includes a plurality of hollow vias extending through the package substrate. The semiconductor die is electrically connected to the package substrate. The hollow vias are disposed under the semiconductor die.

19 Claims, 29 Drawing Sheets

SEMICONDUCTOR PACKAGE STRUCTURE AND ELECTRONIC DEVICE

CROSS-REFERENCE TO RELATED APPLICATIONS

This application claims the benefit of and priority to U.S. Provisional Application No. 62/806,563, filed Feb. 15, 2019, the contents of which are incorporated herein by reference in their entirety.

BACKGROUND

1. Field of the Disclosure

The present disclosure relates to a semiconductor package structure and an electronic device including the same, and to a semiconductor package structure including a package substrate with a plurality of hollow vias and an electronic device including the same.

2. Description of the Related Art

A specification of a semiconductor package structure may include a high-speed data transmission capability, a high data capacity and a small footprint. Heat dissipation is also an issue for such a semiconductor package structure. During operation, high-speed data transmission can result in a significant amount of heat being generated and can raise a temperature of the semiconductor package structure. Due to the small size of the semiconductor package structure, it can be difficult to dissipate the heat. If the heat is not dissipated efficiently, the performance of the semiconductor package structure can be decreased, or the semiconductor package structure may break down or be rendered inoperative.

SUMMARY

In some embodiments, a semiconductor package structure includes a package substrate and a semiconductor die. The package substrate includes a plurality of hollow vias extending through the package substrate. The semiconductor die is electrically connected to the package substrate. The hollow vias are disposed under the semiconductor die.

In some embodiments, an electronic device includes a semiconductor package structure, a main substrate and a heat dissipating device. The semiconductor package structure includes a package substrate and a semiconductor die. The package substrate includes a plurality of first hollow vias extending through the package substrate. The semiconductor die is electrically connected to the package substrate. The first hollow vias are disposed under the semiconductor die. The main substrate is electrically connected to the package substrate. The main substrate includes a plurality of second hollow vias extending through the main substrate, and the second hollow vias are aligned with the first hollow vias. The heat dissipating device is used for dissipating a heat generated by the semiconductor die. The heat is transmitted through the second hollow vias and the first hollow vias.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
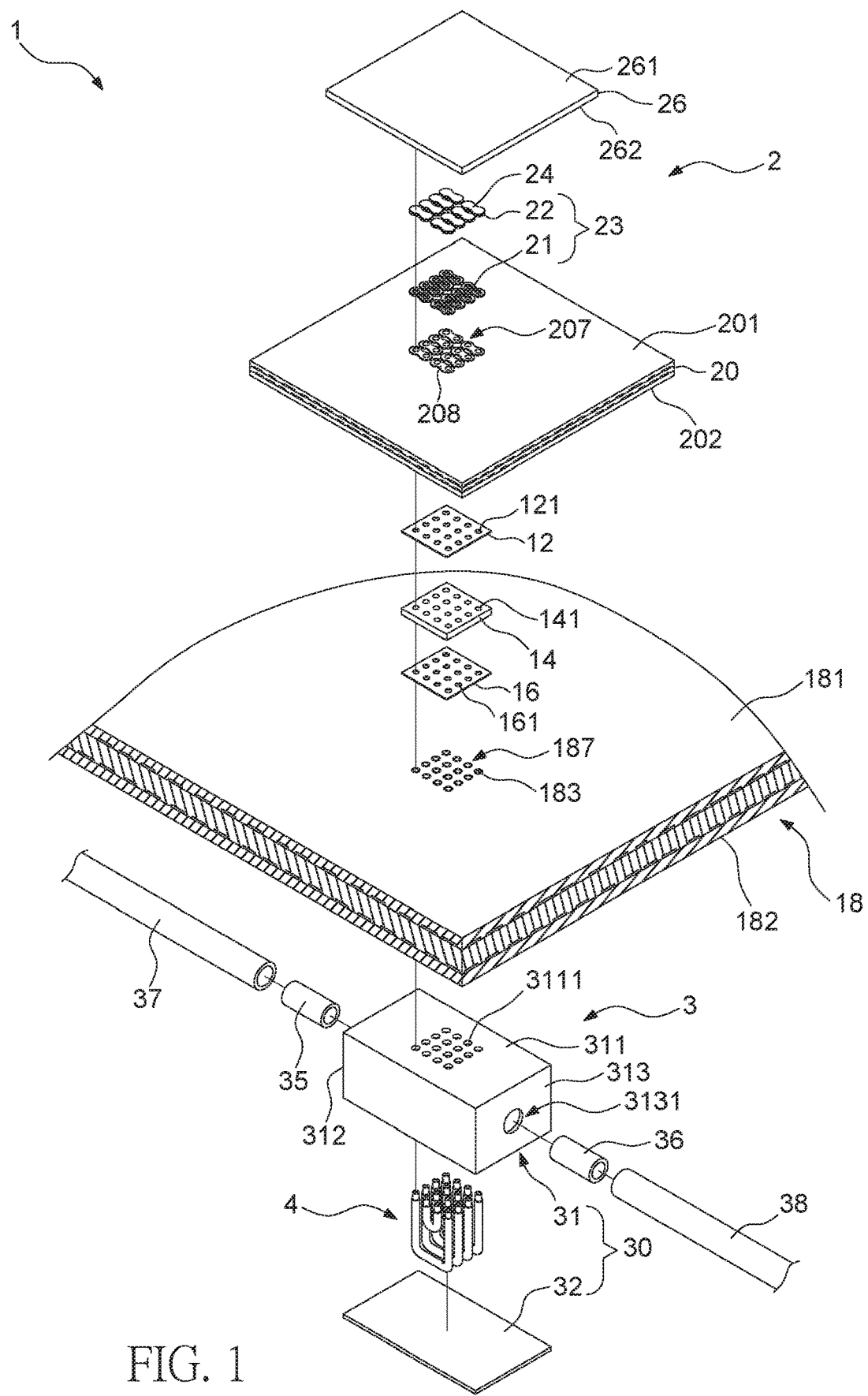
FIG. 1 illustrates an exploded perspective view of an electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing functions, a number of devices integrated in a semiconductor package structure should increase. Thus, the power density and a number of heat sources are increased, and the thermal resistance is relatively large. In addition, it is difficult to dissipate the heat generated by the device at the center of the semiconductor package structure. To address the above concerns, in some comparative embodiments, a fan is provided. The fan is attached to the semiconductor package structure to dissipate the heat at the periphery of the semiconductor package structure by air flow. However, such fan may not dissipate the heat generated by the device at the center of the semiconductor package structure. In some comparative embodiments, a thermal interface material (TIM) is used to be interposed between the devices and the package substrate. However, the temperature of the device at the center of the semiconductor package structure may not be hugely reduced.

At least some embodiments of the present disclosure provide for a semiconductor package structure which has a high improvement of heat dissipation efficiency. In some embodiments, the semiconductor package structure includes including a package substrate with a plurality of hollow vias for dissipating the heat generated by a semiconductor die in the semiconductor package structure.

FIG. 1 illustrates an exploded perspective view of an electronic device 1 according to some embodiments of the present disclosure. The electronic device 1 includes a semiconductor package structure 2, a first elastic layer 12, an intermediate block 14, a second layer 16, a main substrate 18, a heat dissipating device 3 and a plurality of U-shaped pipes 4.

Figure 2:
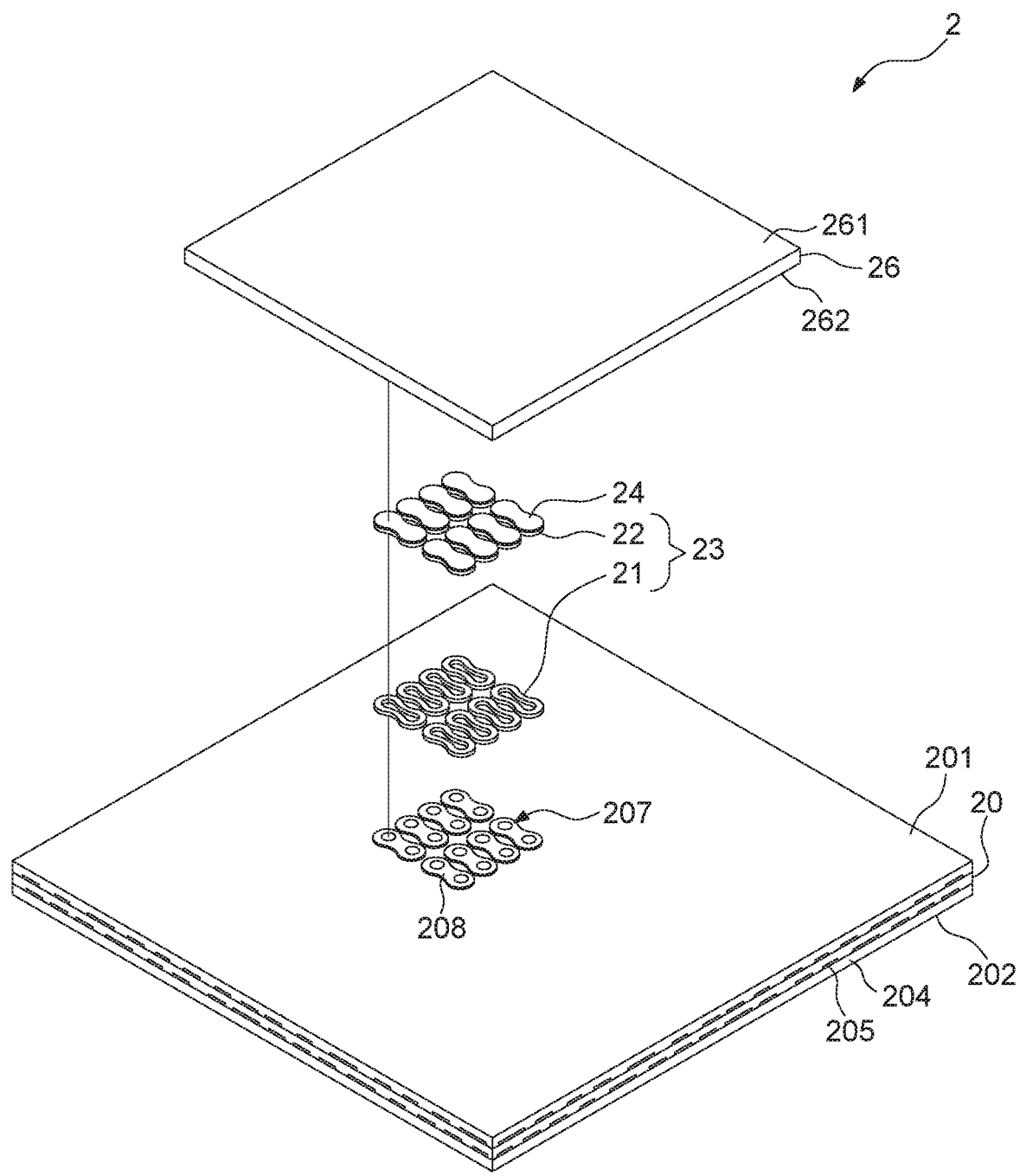
FIG. 2 illustrates an exploded perspective view of a semiconductor package structure of FIG. 1.
Figure 3:
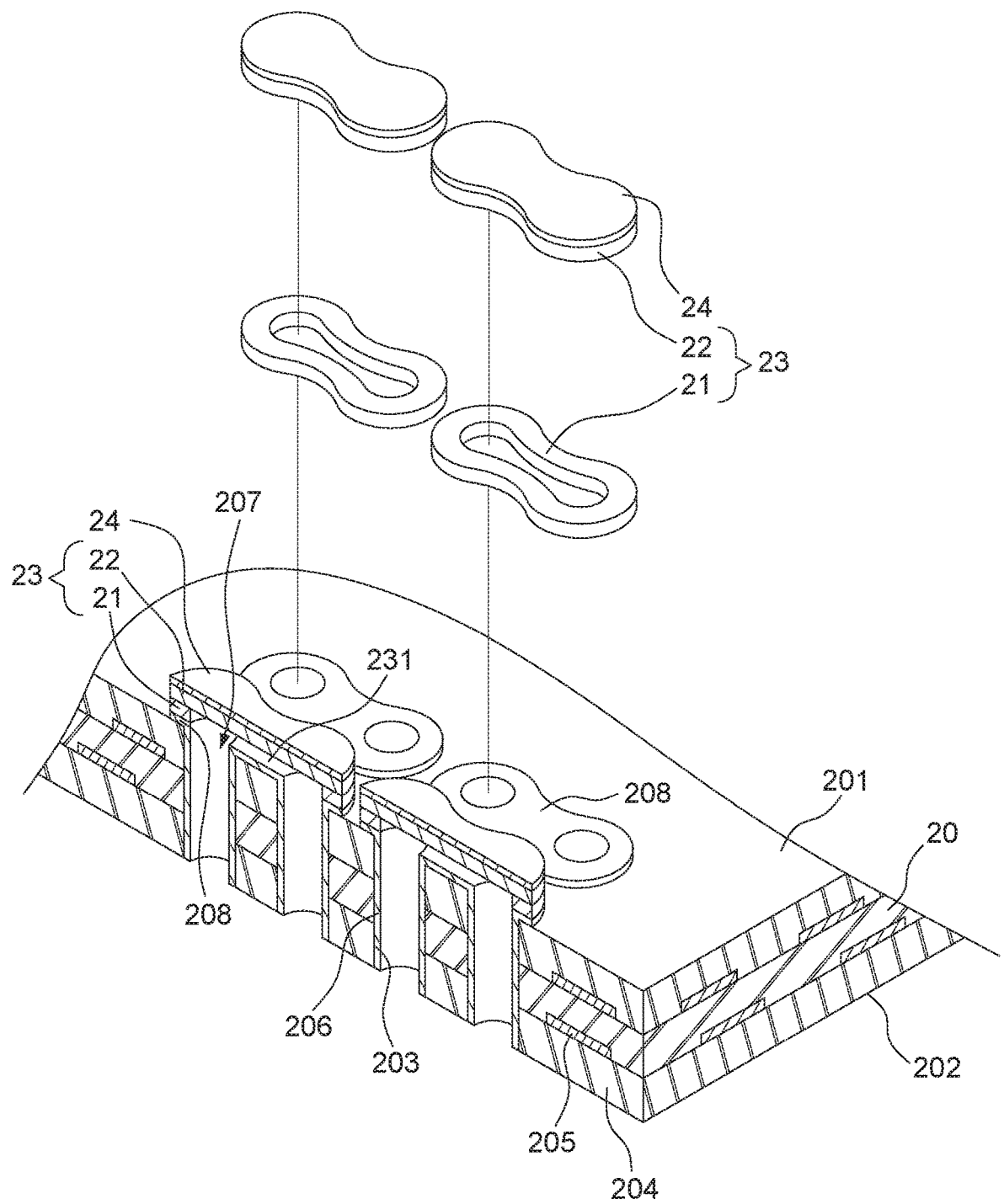
FIG. 3 illustrates a partially enlarged cross-sectional view of a package substrate and cap structures of FIG. 2.
Figure 4:
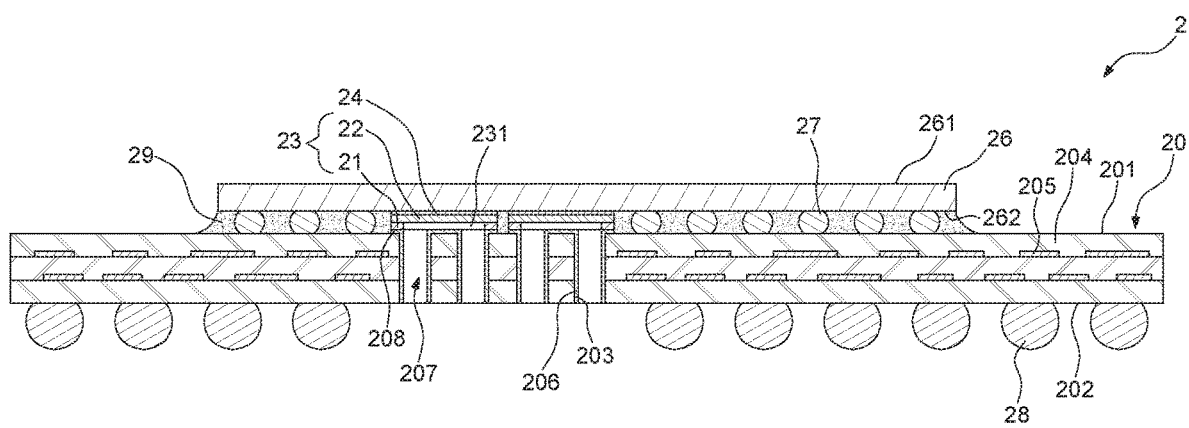
FIG. 4 illustrates a cross-sectional view of a semiconductor package structure of FIG. 1.

FIG. 2 illustrates an exploded perspective view of a semiconductor package structure 2 of FIG. 1. FIG. 3 illustrates a partially enlarged cross-sectional view of the package substrate 20 and the cap structures 23 of FIG. 2. FIG. 4 illustrates a cross-sectional view of the semiconductor package structure 2 of FIG. 1. The semiconductor package structure 2 includes a package substrate 20, a plurality of cap structures 23, a solder paste 24, a semiconductor die 26, a plurality of inner connecting elements 27 (e.g., solder bumps) and a plurality of external connecting elements 28 (e.g., solder bumps).

The package substrate 20 has a first surface 201 and a second surface 202 opposite to the first surface 201, and includes a plurality of passivation layers 204 and at least one circuit layer 205. The circuit layers 205 (e.g., redistribution layer (RDL)) is interposed between the passivation layers 204. The package substrate 20 defines a plurality of first hollow through holes 203, and further includes a plurality of inner layers 206. The first hollow through holes 203 extend between the first surface 201 and the second surface 202, and extend through the package substrate 20. The inner layers 206 are disposed on the inner surfaces of the first hollow through holes 203 to form a plurality of first hollow vias 207. In one embodiment, the inner layers 206 are plating layers that are plated on the inner surfaces of the first hollow through holes 203. A material of the inner layers 206 may be metal such as copper, aluminum, stainless steel, oxygen-free copper or other suitable metal. The inner layers 206 do not fill the first hollow through holes 203 so as to define a plurality of central holes (e.g., the first hollow vias 207). The central holes (e.g., the first hollow vias 207) may be empty and may be not filled by any other material. Thus, the package substrate 20 includes the first hollow vias 207 extending through the package substrate 20. It is noted that the function and size of the first hollow via 207 is different from the function and size of the electrical conductive via (not shown). The diameter of the first hollow via 207 may be greater than 100 μm or more, greater than 150 μm or more, or greater than 200 μm or more. The first hollow vias 207 are used for a fluid to flow through or a vapor to flow through for heat dissipation. That is, the first hollow via 207 is a portion of a heat dissipation path. In one embodiment, the circuit layer 205, the inner connecting elements 27 and the external connecting elements 28 may not contact the inner layers 206, and are electrically insulated from the inner layers 206. Thus, the first hollow vias 207 are not electrically connected to the circuit layer 205, the inner connecting elements 27 and the external connecting elements 28.

In comparison, the electrical conductive via may be formed by filling with a conductive material or by plating a metal layer and then filling with an insulation material. That is, the electrical conductive via may be a solid via. The diameter of the electrical conductive via may be less than 100 μm, 80 μm or 60 μm or less. The electrical conductive via are used for electrical connection. That is, the electrical conductive via may be a portion of electrical conductive path. In one embodiment, the circuit layer 205, the inner connecting elements 27 and/or the external connecting elements 28 may contact the electrical conductive via. Thus, the electrical conductive via may be electrically connected to the circuit layer 205, the inner connecting elements 27 and/or the external connecting elements 28.

However, in some embodiments, the first hollow vias 207 may be electrically connected to the circuit layer 205, the inner connecting elements 27 and/or the external connecting elements 28. In addition, the inner layers 206 may be omitted, and the inner surfaces of the first hollow through holes 203 define the first hollow vias 207.

As shown in FIG. 3, portions of the inner layers 206 may extend to the first surface 201 of the package substrate 20 to form a plurality of base regions 208. Two first hollow vias 207 may be disposed within one base region 208. The cap structures 23 are disposed between the package substrate 20 and the semiconductor die 26, and each of the cap structures 23 defines a cavity 231. The cap structure 23 includes a periphery wall portion 21 and a top cover portion 22. A material of the periphery wall portion 21 and the top cover portion 22 may be metal such as copper, aluminum, stainless steel, oxygen-free copper or other suitable material. The periphery wall portion 21 is disposed on the periphery of the base region 208 so as to define the cavity 231. The periphery wall portion 21 may be plated on the base region 208. Alternatively, the periphery wall portion 21 and the base region 208 may be formed concurrently and integrally. The top cover portion 22 covers the periphery wall portion 21 so that the cavity 231 becomes an enclosed space. In some embodiments, the top cover portion 22 and the periphery wall portion 21 may be formed concurrently and integrally so that the cap structure 23 may be a monolithic structure with the cavity 231, and then the cap structure 23 is attached to the base region 208 of the package substrate 20 to cover two of the first hollow vias 207. Thus, the two of the first hollow vias 207 are communicated with each other through the cavity 231 of the cap structure 23. In some embodiments, the solder paste 24 is disposed on the top surface of the top cover portion 22.

As shown in FIG. 4, the semiconductor die 26 is electrically connected to the first surface 201 of the package substrate 20, and the cap structures 23 and the first hollow vias 207 are disposed under the semiconductor die 26. The semiconductor die 26 has a first surface 261 and a second surface 262 (e.g., an active surface) opposite to the first surface 261, and includes the inner connecting elements 27 (e.g., solder bumps) disposed adjacent to the second surface 262. The semiconductor die 26 is electrically connected to the first surface 201 of the package substrate 20 through the inner connecting elements 27 (e.g., solder bumps) by flip chip bonding. After a first reflow process, a height of the inner connecting element 27 may be substantially equal to a height of the cap structure 23, and the cap structure 23 may be attached to the second surface 262 of the semiconductor die 26 through the solder paste 24. However, the solder paste 24 may be omitted, and the top surface of the top cover portion 22 of the cap structure 23 may contact the second surface 262 of the semiconductor die 26 directly. In addition, an underfill 29 (or a molding compound) may be further included to cover and protect the inner connecting elements 27 and the cap structures 23. Further, the external connecting elements 28 (e.g., solder bumps) are disposed adjacent to the second surface 202 of the package substrate 20.

Figure 5:
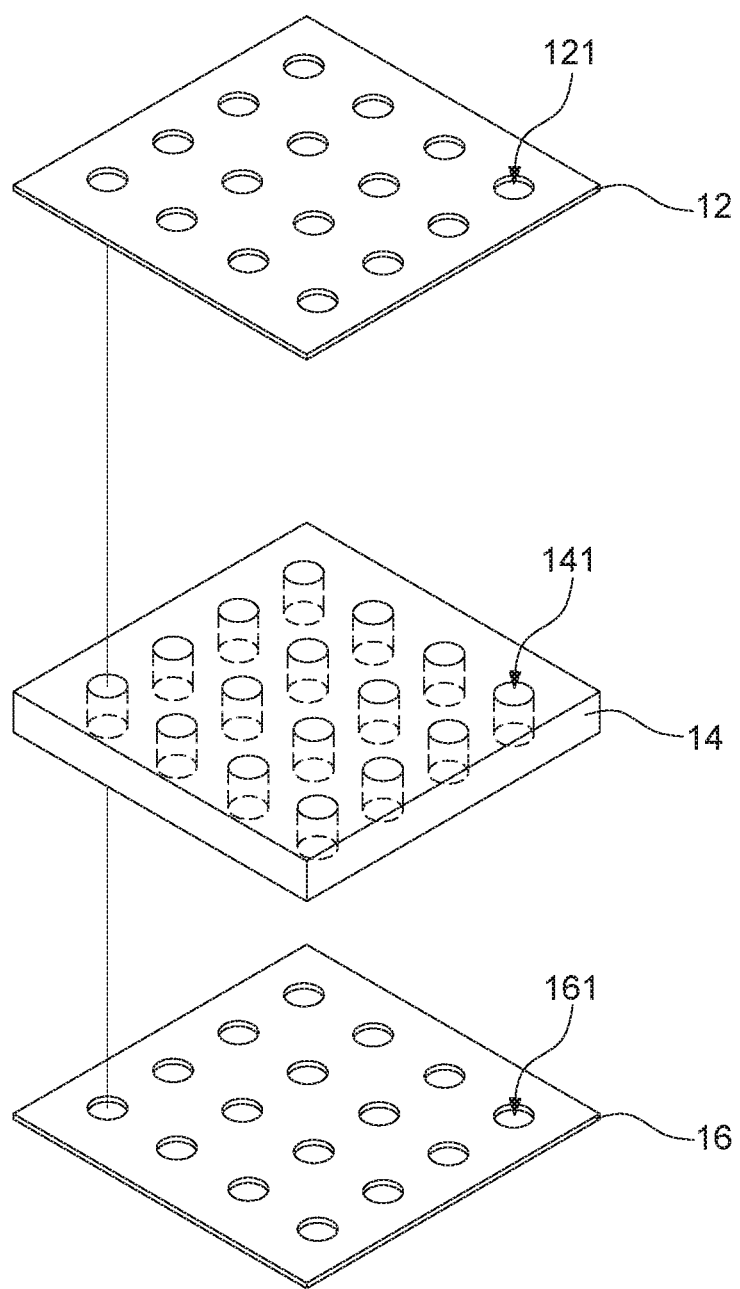
FIG. 5 illustrates a perspective view of a first elastic layer, an intermediate block and a second layer of FIG. 1.

FIG. 5 illustrates a perspective view of the first elastic layer 12, the intermediate block 14 and the second layer 16 of FIG. 1. A material of the first elastic layer 12 and the second layer 16 may be a rubber or plastic material. The first elastic layer 12 may define a plurality of through holes 121, and the second layer 16 may define a plurality of through holes 161. A material of the intermediate block 14 may be metal such as copper, aluminum, stainless steel, oxygen-free copper or other suitable material. The intermediate block 14 may have a consistent thickness, and may define a plurality of through holes 141. The first elastic layer 12 may be disposed on the top surface of the intermediate block 14, and the second layer 16 may be disposed on the bottom surface of the intermediate block 14. The through holes 121 of the first elastic layer 12 and the through holes 161 of the second layer 16 are aligned with the through holes 141 of the intermediate block 14. The first elastic layer 12 and the second layer 16 may increase the sealing effect so as to prevent the leakage of fluid or vapor.

Figure 6:
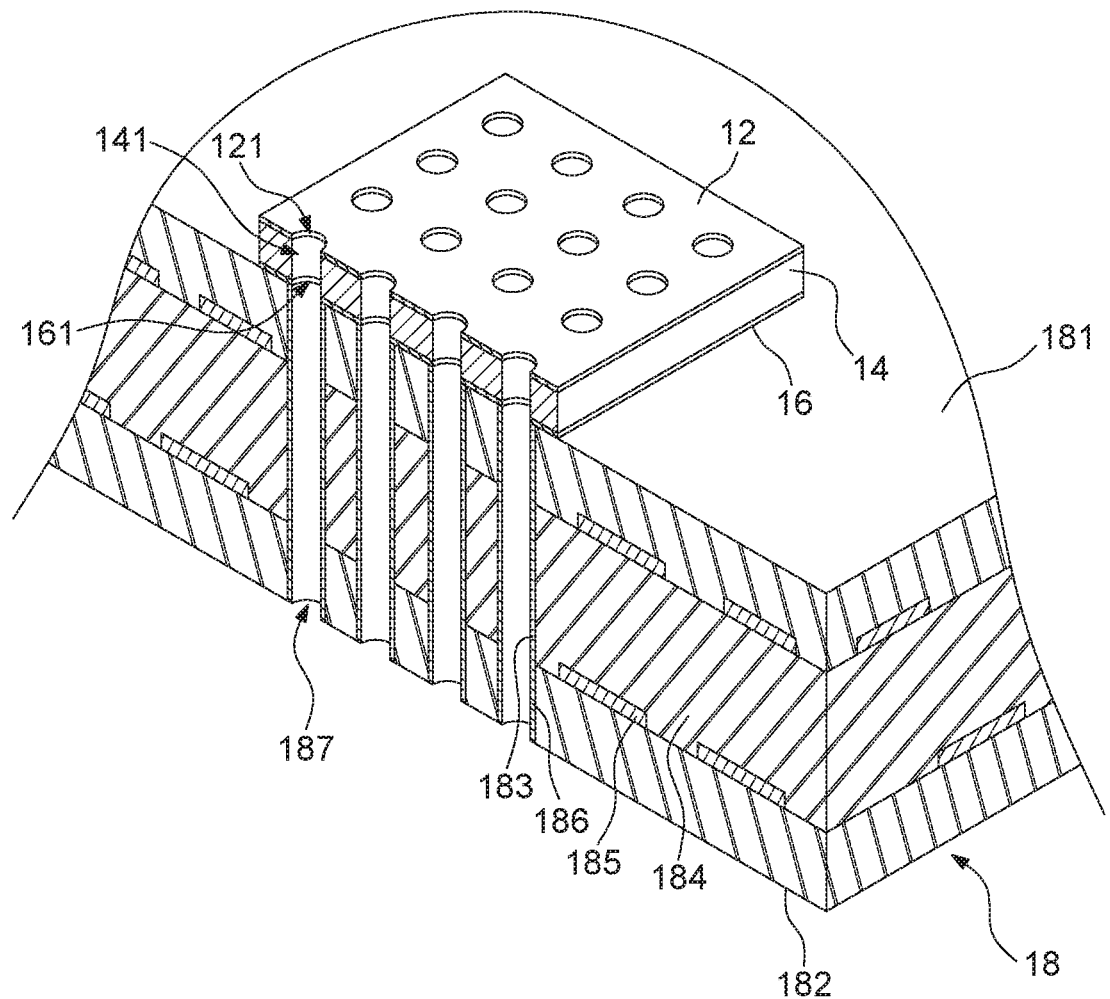
FIG. 6 illustrates a partially enlarged perspective cross-sectional view of an assembly of a first elastic layer, an intermediate block, a second layer and a main substrate of FIG. 1.

FIG. 6 illustrates a partially enlarged perspective cross-sectional view of an assembly of the first elastic layer 12, the intermediate block 14, the second layer 16 and the main substrate 18 of FIG. 1. The main substrate 18 has a first surface 181 and a second surface 182 opposite to the first surface 181, and includes a plurality of passivation layers 184 and at least one circuit layer 185. The circuit layers 185 (e.g., redistribution layer (RDL)) is interposed between the passivation layers 184. The main substrate 18 defines a plurality of second hollow through holes 183, and further includes a plurality of inner layers 186. The second hollow through holes 183 extend between the first surface 181 and the second surface 182, and extend through the main substrate 18. The inner layers 186 are disposed on the inner surfaces of the second hollow through holes 183 to form a plurality of second hollow vias 187. In one embodiment, the inner layers 186 are plating layers that are plated on the inner surfaces of the second hollow through holes 183. A material of the inner layers 186 may be metal such as copper, aluminum, stainless steel, oxygen-free copper or other suitable metal. The inner layers 186 may not fill the second hollow through holes 183 so as to define a plurality of central holes (e.g., the second hollow vias 187). The central holes (e.g., the second hollow vias 187) may be empty and may be not filled by any other material. Thus, the main substrate 18 includes the second hollow vias 187 extending through the main substrate 18. It is noted that the function and size of the second hollow via 187 is different from the function and size of the electrical conductive via (not shown). The diameter of the second hollow via 187 may be greater than 100 μm or more, greater than 150 μm or more, or greater than 200 μm or more. The second hollow vias 187 are used for a fluid to flow through or a vapor to flow through for heat dissipation. That is, the second hollow via 187 is a portion of a heat dissipation path. In one embodiment, the circuit layer 185 and the external connecting elements 28 may not contact the inner layers 186, and may be electrically insulated from the inner layers 186. Thus, the second hollow vias 187 may be not electrically connected to the circuit layer 185 and the external connecting elements 28. However, in some embodiments, the second hollow vias 187 may be electrically connected to the circuit layer 185 and/or the external connecting elements 28. In addition, the inner layers 186 may be omitted, and the inner surfaces of the second hollow through holes 183 define the second hollow vias 187. As shown in FIG. 6, the second hollow vias 187 are aligned with the through holes 141 of the intermediate block 14. Thus, the intermediate block 14 is disposed or interposed between the package substrate 20 and the main substrate 18. The through holes 141 of the intermediate block 14 are aligned with and communicated with the second hollow vias 187 and the first hollow vias 207.

Figure 7:
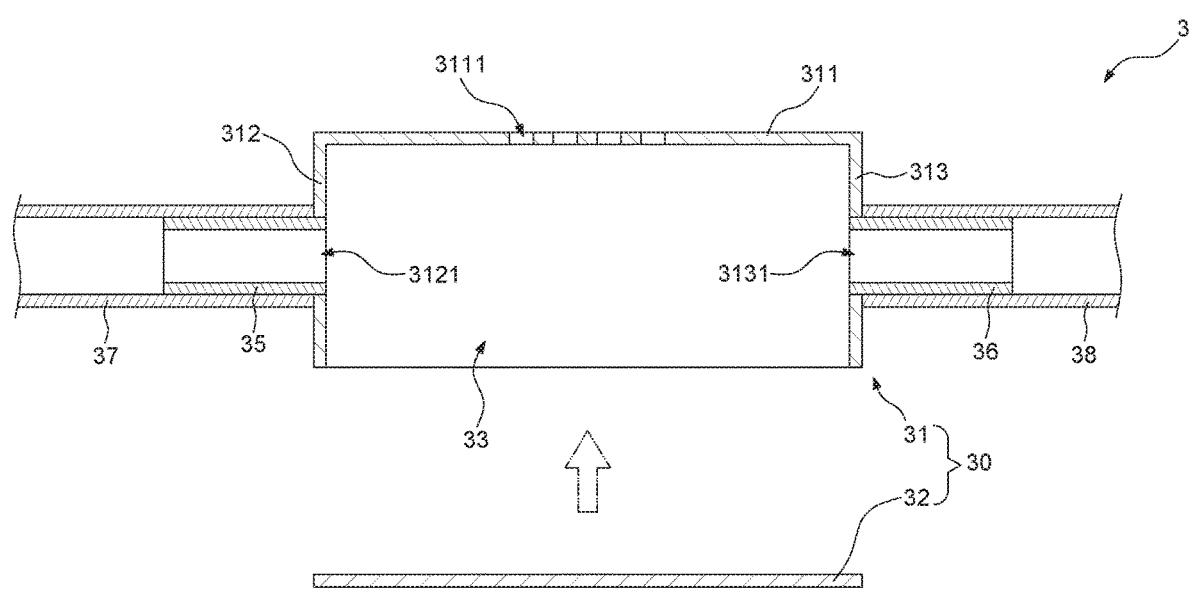
FIG. 7 illustrates a cross-sectional view of an assembly of a heat dissipating device of FIG. 1.
Figure 10:
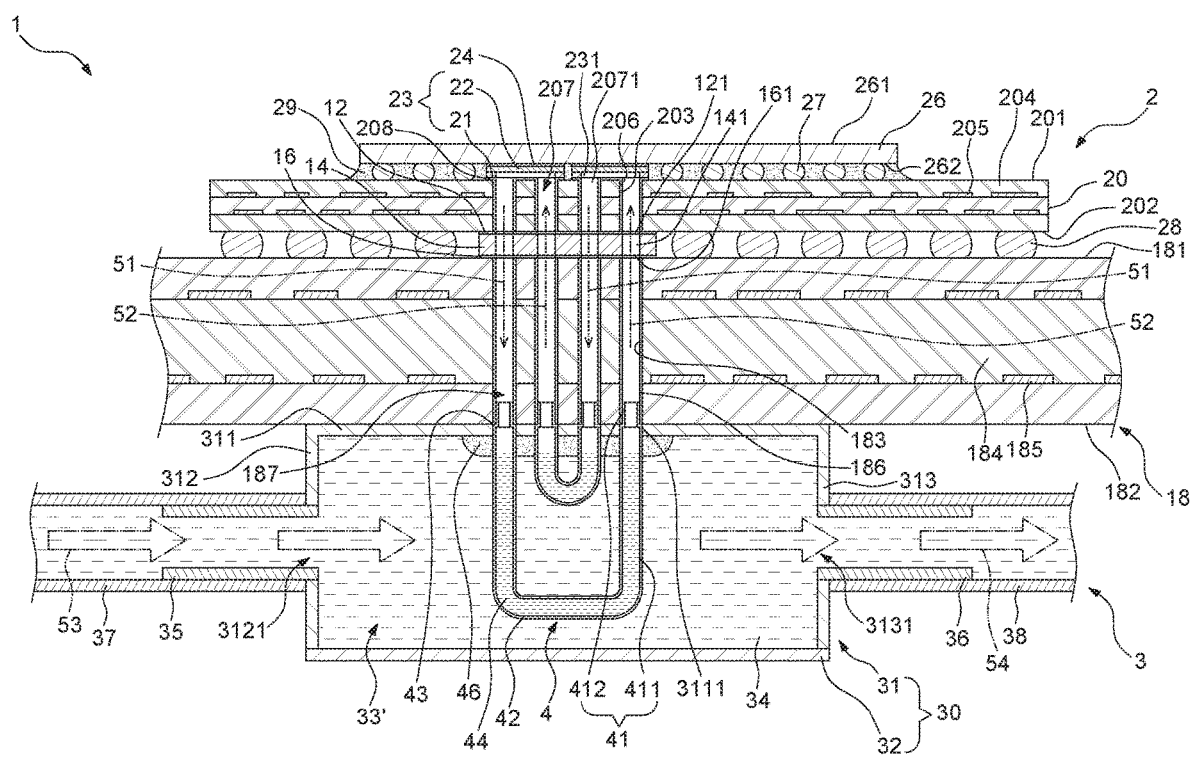
FIG. 10 illustrates a cross-sectional assembly view of the electronic device of FIG. 1.

FIG. 7 illustrates a cross-sectional view of an assembly of the heat dissipating device 3 of FIG. 1. The heat dissipating device 3 includes a condenser structure 30, a first connecting tube 35, a first channel 37, a second connecting tube 36 and a second channel 38. The condenser structure 30 includes a cap housing 31 and a bottom wall 32. The cap housing 31 defines an open cavity 33, and at least includes a top wall 311, a first wall 312 and a second wall 313. As shown in FIG. 10, when the bottom wall 32 covers the bottom of the cap housing 31, the open cavity 33 may become an enclosed chamber 33', that is, the condenser structure 30 may define the enclosed chamber 33' for accommodating the second working fluid 34. As shown in FIG. 7, the top wall 311 may define a plurality of through holes 3111 corresponding to the second hollow vias 187 of the main substrate 18. The first wall 312 may define a through hole 3121, and the first connecting tube 35 is inserted into the through hole 3121. The first channel 37 is secured to the first connecting tube 35. The second wall 313 may define a through hole 3131, and the second connecting tube 36 is inserted into the through hole 3131. The second channel 38 is secured to the second connecting tube 36. Therefore, the first channel 37 and the second channel 38 are communicated with the enclosed chamber 33' (or the open cavity 33) of the condenser structure 30.

Figure 8:
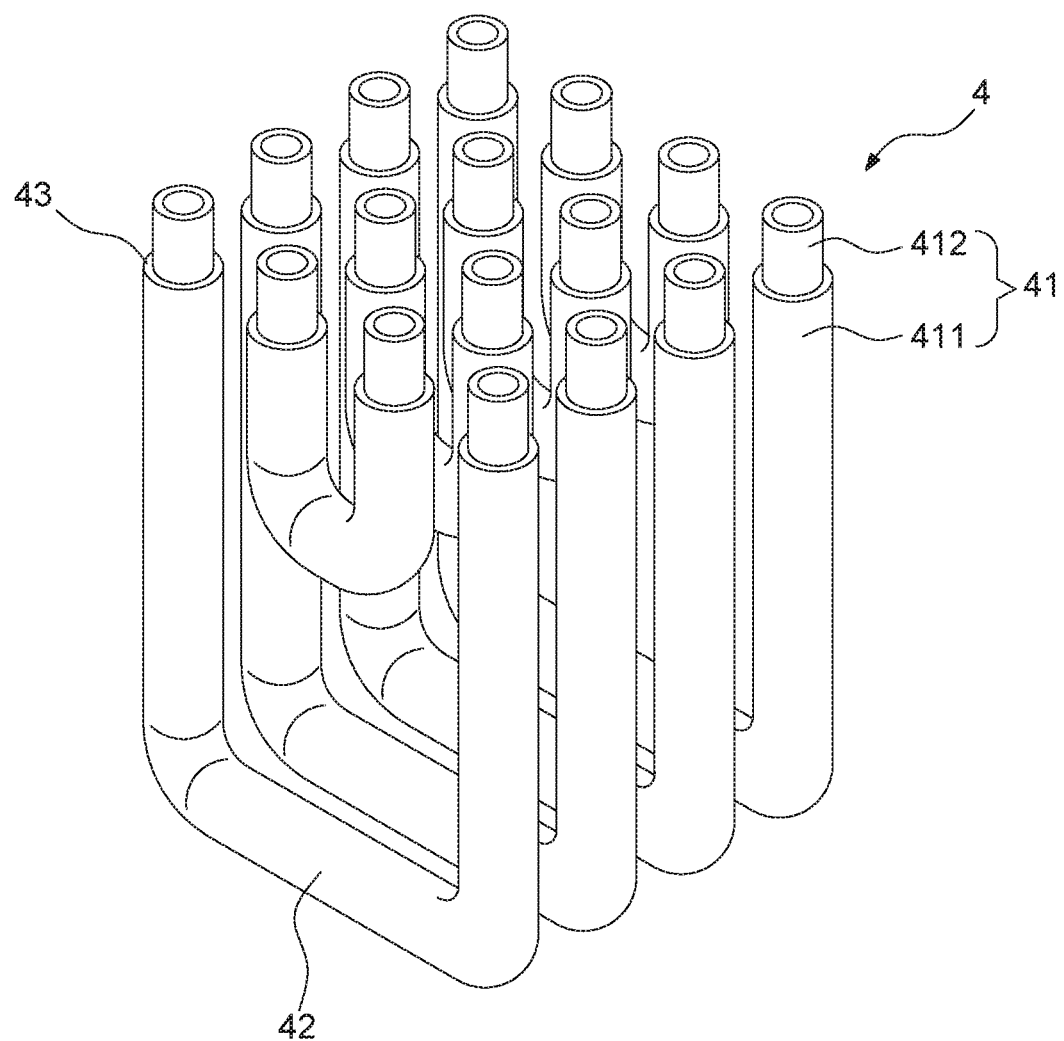
FIG. 8 illustrates a perspective view of U-shaped pipes of FIG. 1.

FIG. 8 illustrates a perspective view of the U-shaped pipes 4 of FIG. 1. Each of the U-shaped pipes 4 includes two ends 41 and a connecting portion 42 connecting the two ends 41. Each of the ends 41 includes a main portion 411 and a joint head portion 412. An outer diameter of the joint head portion 412 is less than an outer diameter of the main portion 411 so as to form a shoulder portion 43. A first working fluid 44 (FIG. 9) may be disposed in each of the U-shaped pipes 4.

Figure 9:
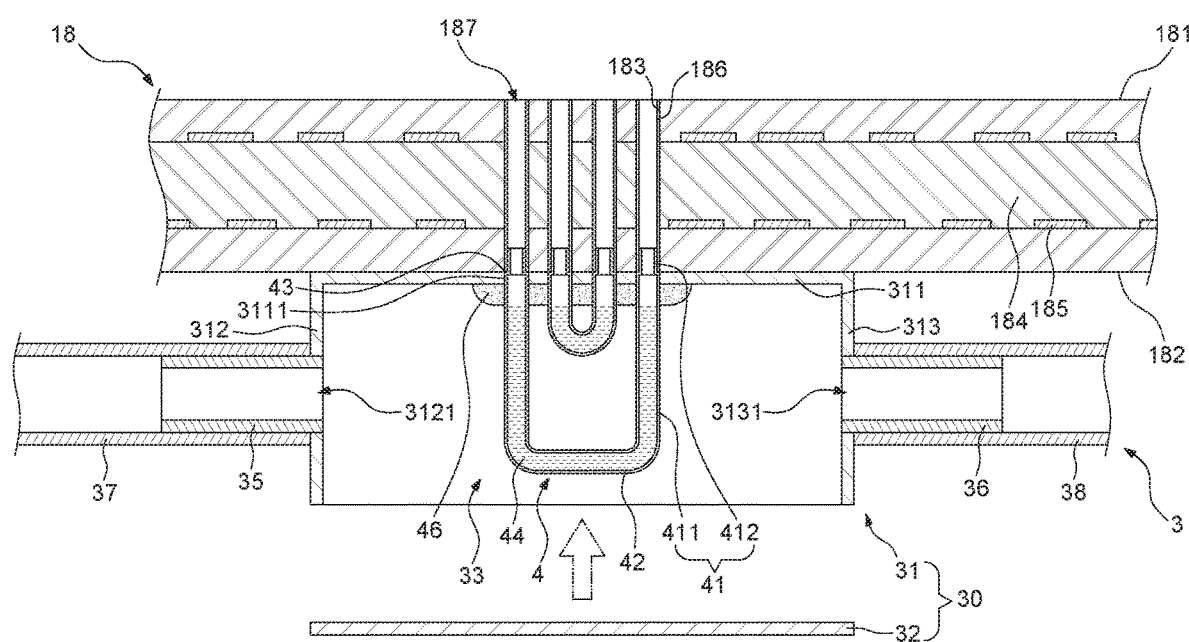
FIG. 9 illustrates a perspective cross-sectional view of an assembly of U-shaped pipes and a main substrate of FIG. 1.

FIG. 9 illustrates a perspective cross-sectional view of an assembly of the U-shaped pipes 4 and the main substrate 18 of FIG. 1. The U-shaped pipes 4 are disposed under the second surface 182 of the main substrate 18. As shown in FIG. 9, the top wall 311 of the cap housing 31 of the condenser structure 30 is attached (e.g., adhered) to the second surface 182 of the main substrate 18, and the through holes 3111 of the top wall 311 are aligned with the second hollow vias 187 of the main substrate 18. It is noted that a waterproof material (e.g., an elastic layer) may be interposed or sandwiched between the top wall 311 of the cap housing 31 and the second surface 182 of the main substrate 18. Then, the two ends 41 of each of the U-shaped pipes 4 pass through (penetrate through) the through holes 3111 of the top wall 311, and are connected to two of the second hollow vias 187 respectively, so that the two of the second hollow vias 187 are communicated with each other through the U-shaped pipe 4. As shown in FIG. 9, the joint head portion 412 of the U-shaped pipe 4 is inserted into the second hollow via 187 by close fitting, and the shoulder portion 43 of the U-shaped pipe 4 contacts and sustains the second surface 182 of the main substrate 18. Meanwhile, a bottom portion of each of the U-shaped pipes 4 is disposed or located in the open cavity 33 the cap housing 31. In one embodiment, a solder material 46 may be applied to the bottom surface of the top wall 311 to cover the U-shaped pipes 4 so as to increase the joint quality and prevent the leakage of fluid or vapor. Then, the bottom wall 32 of the condenser structure 30 covers the bottom of the cap housing 31, so that the open cavity 33 may become an enclosed chamber 33' (FIG. 10). Thus, the bottom portion of each of the U-shaped pipes 4 is disposed or located in the enclosed chamber 33' of the condenser structure 30, and the U-shaped pipes 4 are thermally connected to the heat dissipating device 3.

FIG. 10 illustrates a cross-sectional assembly view of the electronic device 1 of FIG. 1. After the semiconductor package structure 2 and the intermediate block 14 (with the first elastic layer 12 and the second layer 16) are placed on the main substrate 18, a second reflow process is conducted. Thus, the package substrate 20 of the semiconductor package structure 2 is bonded or attached to the first surface 181 of the main substrate 18 through the external connecting elements 28. Meanwhile, the intermediate block 14 (with the first elastic layer 12 and the second layer 16) are clamped by the second surface 202 of the package substrate 20 of the semiconductor package structure 2 and the first surface 181 of the main substrate 18. A height of the external connecting element 28 may be substantially equal to a sum of the thicknesses of the intermediate block 14, the first elastic layer 12 and the second layer 16. However, the first elastic layer 12 and the second layer 16 may be omitted, thus, the top surface of the intermediate block 14 may contact the second surface 202 of the package substrate 20 directly, and the bottom surface of the intermediate block 14 may contact the first surface 181 of the main substrate 18 directly. Then, the U-shaped pipes 4 and the condenser structure 30 are attached or connected to the second surface 182 of the main substrate 18 as shown in FIG. 9.

As shown in FIG. 10, two U-shaped pipes 4, four second hollow vias 187, four through holes 141 of the intermediate block 14, four first hollow vias 207 and two cap structures 23 form an enclosed loop. The enclosed loop is an enclosed space for accommodating a first working fluid 44 and is used for a heat dissipating path. A material of the first working fluid 44 may be water, ethanol, acetone, isopropanol, chlorofluorocarbon (CFC) or other suitable material. In addition, the second working fluid 34 flows in the first channel 37, the enclosed chamber 33' and the second channel 38, and contacts the portion of each of the U-shaped pipes 4 in the enclosed chamber 33'. A material of the second working fluid 34 may be water, ethanol, acetone, isopropanol, chlorofluorocarbon (CFC) or other suitable material. During the operation of the semiconductor die 26, the heat generated by the semiconductor die 26 will be absorbed by the top cover portion 22 of the cap structure 23 to heat the air at the top portions 2071 of the first hollow vias 207 and, then, the heated air will move downwardly to the bottom of the U-shaped pipe 4, as shown in the first path 51. Then, the first working fluid 44 in the U-shaped pipe 4 will be pressed to move upwardly to the top portions 2071 of the first hollow vias 207 to contact the top cover portion 22 of the cap structure 23, as shown in the second path 52. The first working fluid 44 will absorb the heat generated by the semiconductor die 26 and will become high-temperature fluid or high-temperature vapor. Then, the high-temperature fluid or high-temperature vapor will move downwardly to the bottom of the U-shaped pipe 4 along the first path 51. Then, the high-temperature fluid or high-temperature vapor in the bottom of the U-shaped pipe 4 will be cooled by the second working fluid 34 to become liquid state, and then will move upwardly along the second path 52. Thus, the circulation of the first working fluid 44 and its vapor forms a loop of thermal convection. Meanwhile, the low-temperature second working fluid 34 flows into the enclosed chamber 33' of the condenser structure 30 of the heat dissipating device 3 through the first channel 37, as shown in the third path 53, and contacts the bottom portion of each of the U-shaped pipes 4 in the enclosed chamber 33'. Then, the low-temperature second working fluid 34 cools the high-temperature fluid or high-temperature vapor in the bottom of the U-shaped pipe 4. Then, the second working fluid 34 becomes a high-temperature fluid and flows out the enclosed chamber 33' of the condenser structure 30 through the second channel 38, as shown in the fourth path 54. Therefore, the heat generated by the semiconductor die 26 is carried out by the first working fluid 44 and the second working fluid 34. Since, the cap structure 23 is very close to the second surface 262 of the semiconductor die 26, e.g., the loop of thermal convection is very close to the hot spot of the semiconductor die 26, the heat dissipation efficiency is relatively high.

Figure 11:
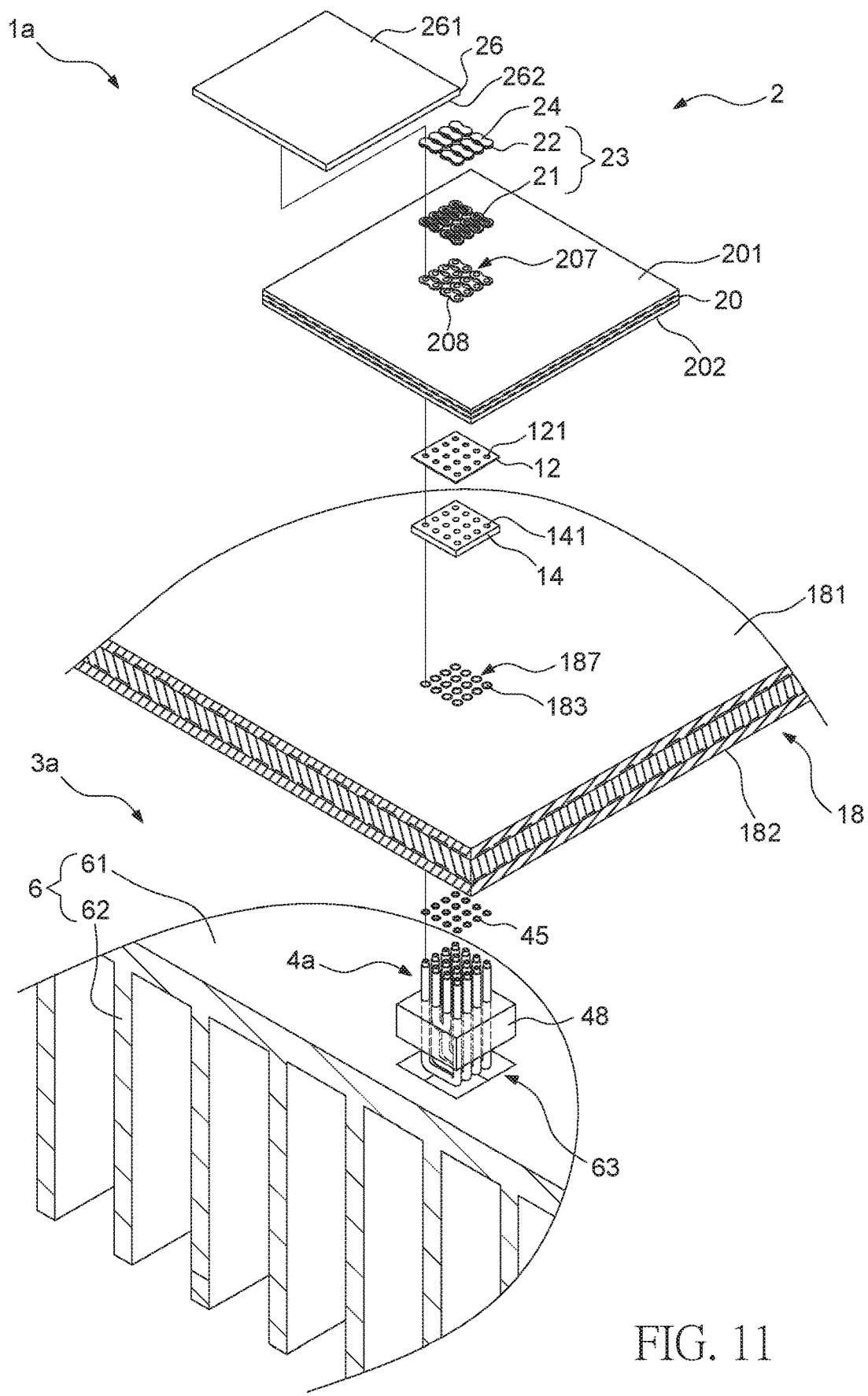
FIG. 11 illustrates an exploded perspective view of an electronic device according to some embodiments of the present disclosure.

FIG. 11 illustrates an exploded perspective view of an electronic device 1a according to some embodiments of the present disclosure. The electronic device 1a is similar to the electronic device 1 of FIG. 1, and the differences are described as follows. The electronic device 1a includes a semiconductor package structure 2, a first elastic layer 12, an intermediate block 14, a main substrate 18, a plurality of U-shaped pipes 4a, a thermally conductive adhesive material 48 and a heat dissipating device 3a. The semiconductor package structure 2, the first elastic layer 12, the intermediate block 14 and the main substrate 18 of FIG. 11 are similar to the semiconductor package structure 2, the first elastic layer 12, the intermediate block 14 and the main substrate 18 of FIG. 1.

Figure 12:
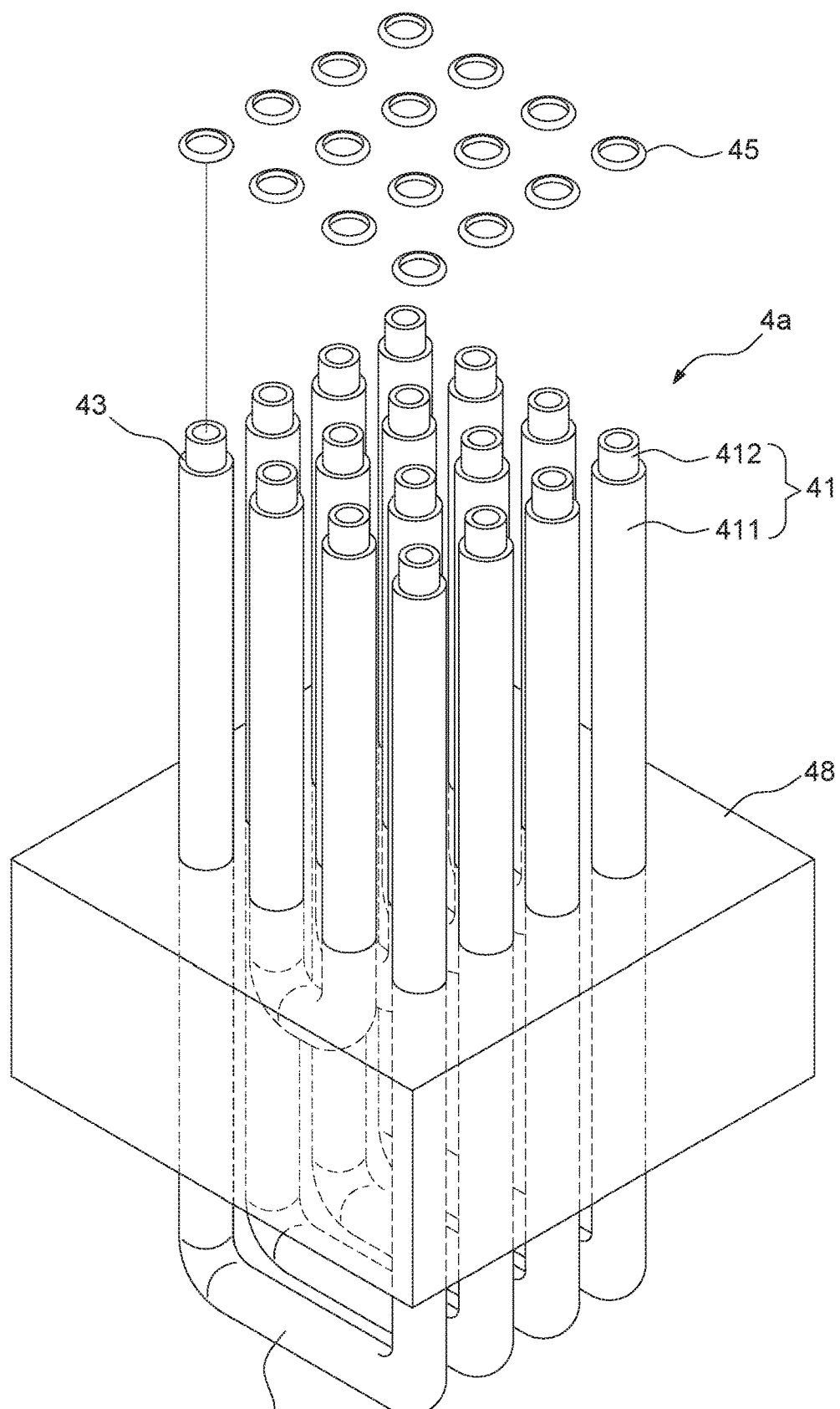
FIG. 12 illustrates a perspective view of U-shaped pipes of FIG. 11.

FIG. 12 illustrates a perspective view of the U-shaped pipes 4a of FIG. 11. Each of the U-shaped pipes 4a includes two ends 41 and a connecting portion 42 connecting the two ends 41. Each of the ends 41 includes a main portion 411 and a joint head portion 412. An outer diameter of the joint head portion 412 is less than an outer diameter of the main portion 411 so as to form a shoulder portion 43. The length of the main portion 411 of the U-shaped pipe 4a of FIG. 12 is greater than the length of the main portion 411 of the U-shaped pipe 4 of FIG. 8, and is also greater than the thickness of the main substrate 18. A first working fluid 44 may be disposed in each of the U-shaped pipes 4. In addition, an O-ring 45 may be disposed on the joint head portion 412 and contact the shoulder portion 43. Further, portions of the U-shaped pipes 4a are wrapped by the thermally conductive adhesive material 48. That is, portions of the U-shaped pipes 4a are embedded in the thermally conductive adhesive material 48, and the main portion 411 of the U-shaped pipes 4a extend through the thermally conductive adhesive material 48. The material of the thermally conductive adhesive material 48 may be thermally conductive gel, AB glue, or other suitable material.

Figure 13:
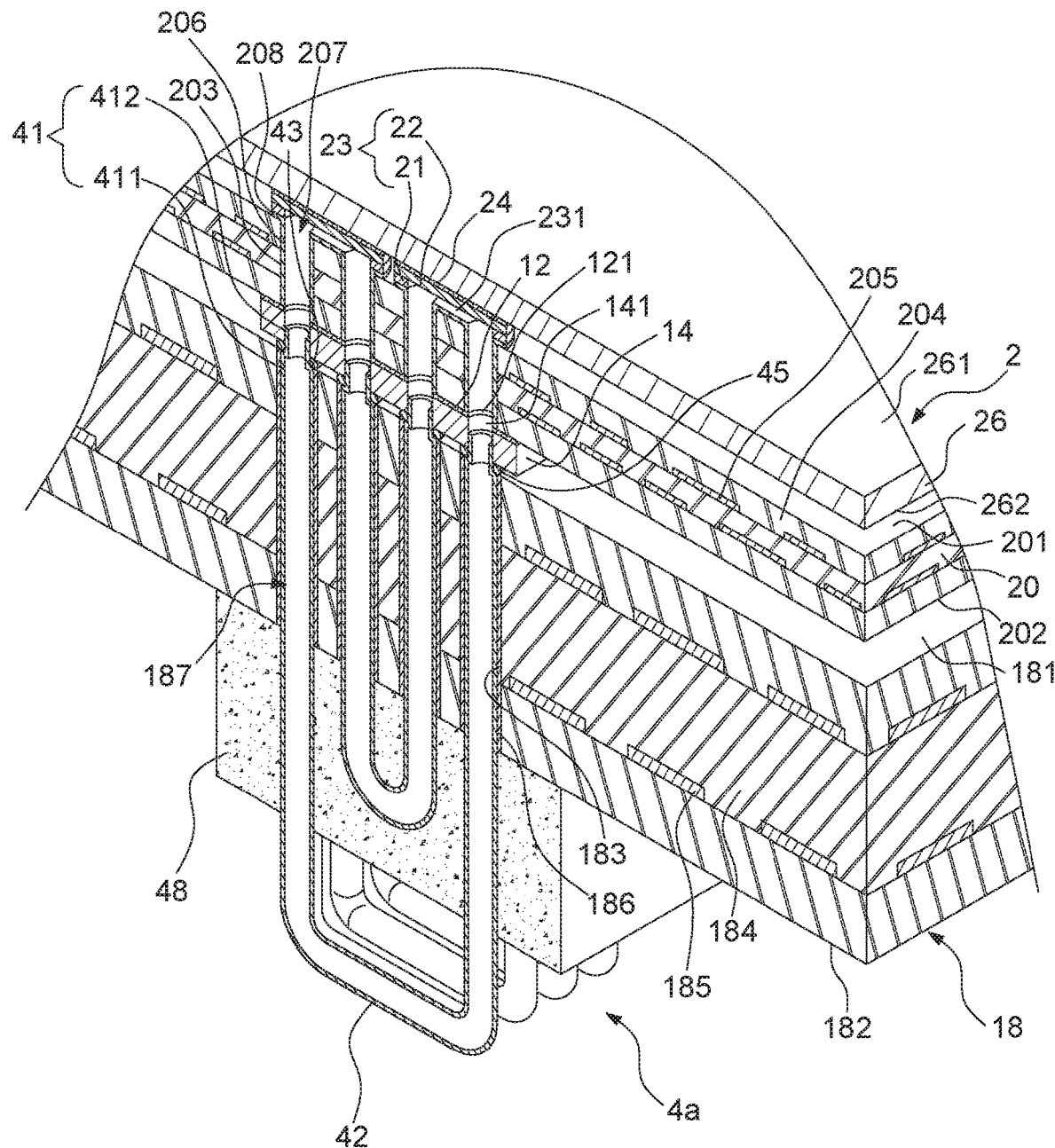
FIG. 13 illustrates a perspective cross-sectional view of an assembly of U-shaped pipes, a main substrate and a semiconductor package structure of FIG. 11.

FIG. 13 illustrates a perspective cross-sectional view of an assembly of the U-shaped pipes 4a, the main substrate 18 and the semiconductor package structure 2 of FIG. 11. The U-shaped pipes 4a are disposed under the second surface 182 of the main substrate 18. The two ends 41 of each of the U-shaped pipes 4a pass through (penetrate through) two of the second hollow vias 187 of the main substrate 18, and are connected to the intermediate block 14 respectively, so that the first hollow vias 207 are communicated with the U-shaped pipe 4a through the through holes 141 of the intermediate block 14. As shown in FIG. 13, the joint head portion 412 of the U-shaped pipe 4a is inserted into the through holes 141 of the intermediate block 14 by close fitting, and the shoulder portion 43 and/or the O-ring 45 the of the U-shaped pipe 4a contacts and sustains the bottom surface of the intermediate block 14 so as to prevent leakage. It is noted that the inner layers 186 on the second hollow through holes 183 of the main substrate 18 may be omitted. Thus, the second hollow vias 187 are defined by only the inner surfaces of the second hollow through holes 183.

Figure 14:
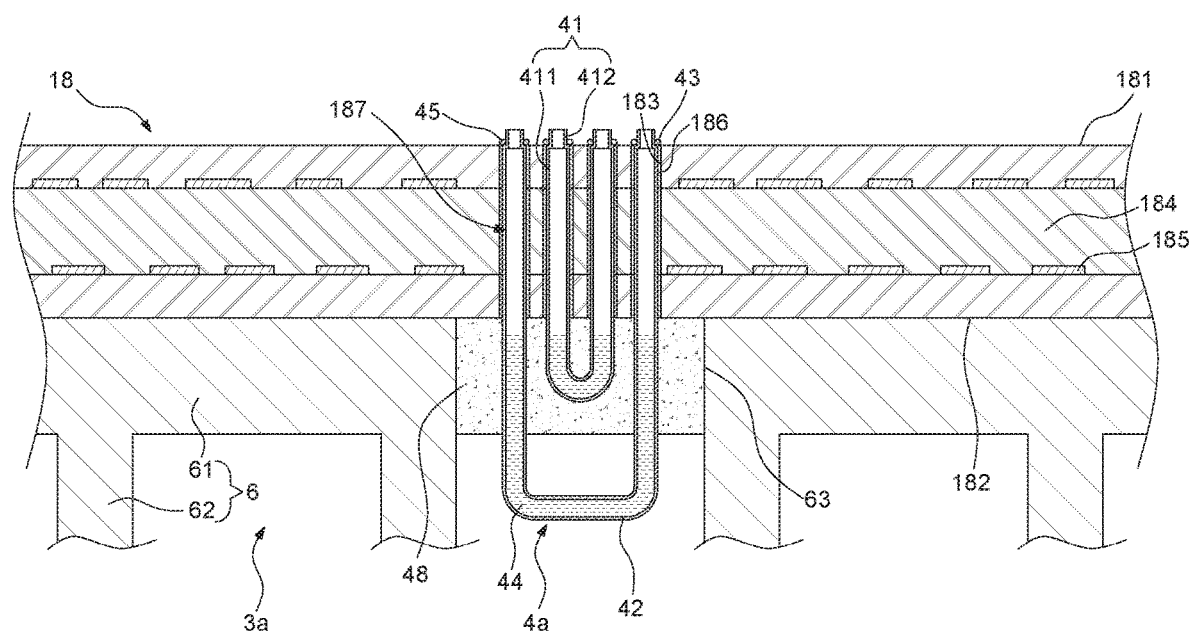
FIG. 14 illustrates a cross-sectional view of an assembly of a heat dissipating device, U-shaped pipes and a main substrate of FIG. 11.

FIG. 14 illustrates a cross-sectional view of an assembly of the heat dissipating device 3a, the U-shaped pipes 4a and the main substrate 18 of FIG. 11. The heat dissipating device 3a includes a heat sink 6 and the thermally conductive adhesive material 48. The heat sink 6 includes a base plate 61 and a plurality of heat dissipating fins 62 disposed on the base plate 61. The base plate 61 defines an opening 63. The opening 63 may extend through the base plate 61 and may be disposed between two heat dissipating fins 62. The size of the opening 63 may be equal to the size of the thermally conductive adhesive material 48 so that the opening 63 can accommodate the thermally conductive adhesive material 48. The portions of the U-shaped pipes 4a and the thermally conductive adhesive material 48 are disposed in the opening 63 of the base plate 61. Therefore, a portion of each of the U-shaped pipes 4a is thermally connected and physically connected to the heat sink 6 through the thermally conductive adhesive material 48.

Figure 15:
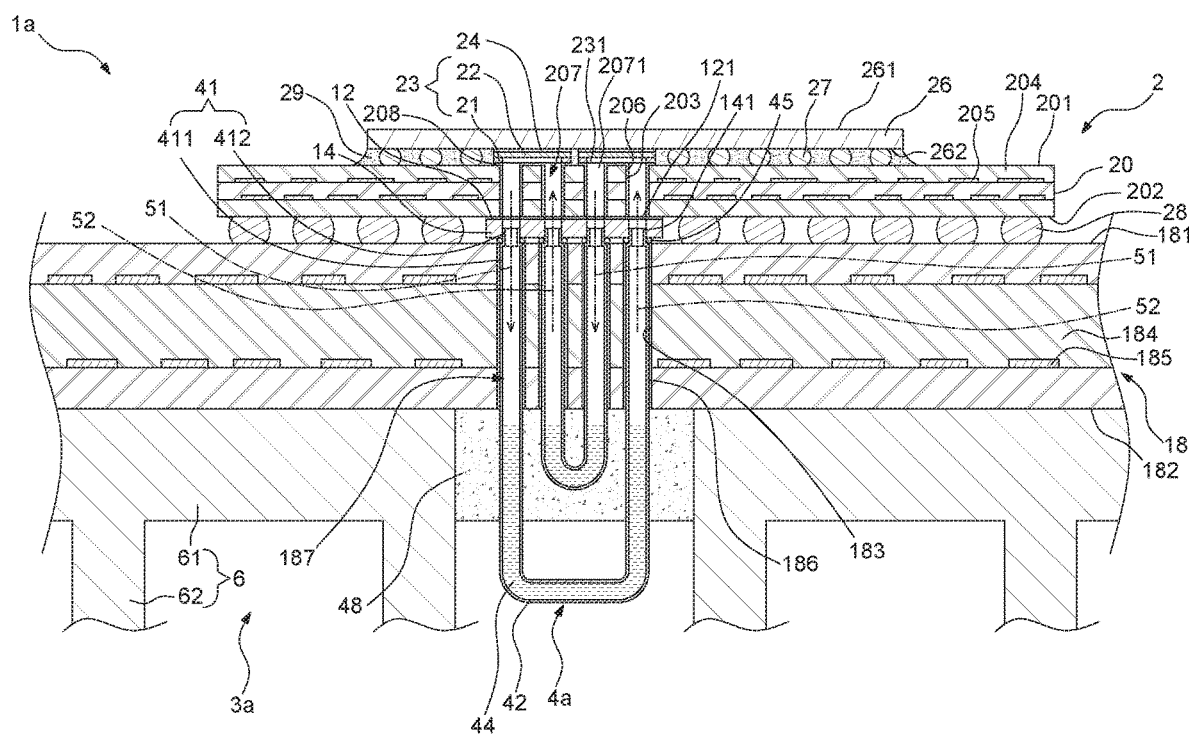
FIG. 15 illustrates a cross-sectional assembly view of the electronic device of FIG. 11.

FIG. 15 illustrates a cross-sectional assembly view of the electronic device 1a of FIG. 11. Two U-shaped pipes 4a, four through holes 141 of the intermediate block 14, four first hollow vias 207 and two cap structures 23 form an enclosed loop. The enclosed loop is an enclosed space for accommodating a first working fluid 44 and is used for a heat dissipating path. In addition, the U-shaped pipes 4a is thermally connected and physically connected to the heat sink 6 through the thermally conductive adhesive material 48. During the operation of the semiconductor die 26, the heat generated by the semiconductor die 26 will be absorbed by the first working fluid 44 in the U-shaped pipe 4a so that the first working fluid 44 may become high-temperature fluid or high-temperature vapor. Then, the high-temperature fluid or high-temperature vapor in the bottom of the U-shaped pipe 4a will be cooled by the heat sink 6 to become liquid state. Thus, the circulation of the first working fluid 44 and its vapor forms a loop of thermal convection similar to the thermal convection as shown in FIG. 10.

Figure 16:
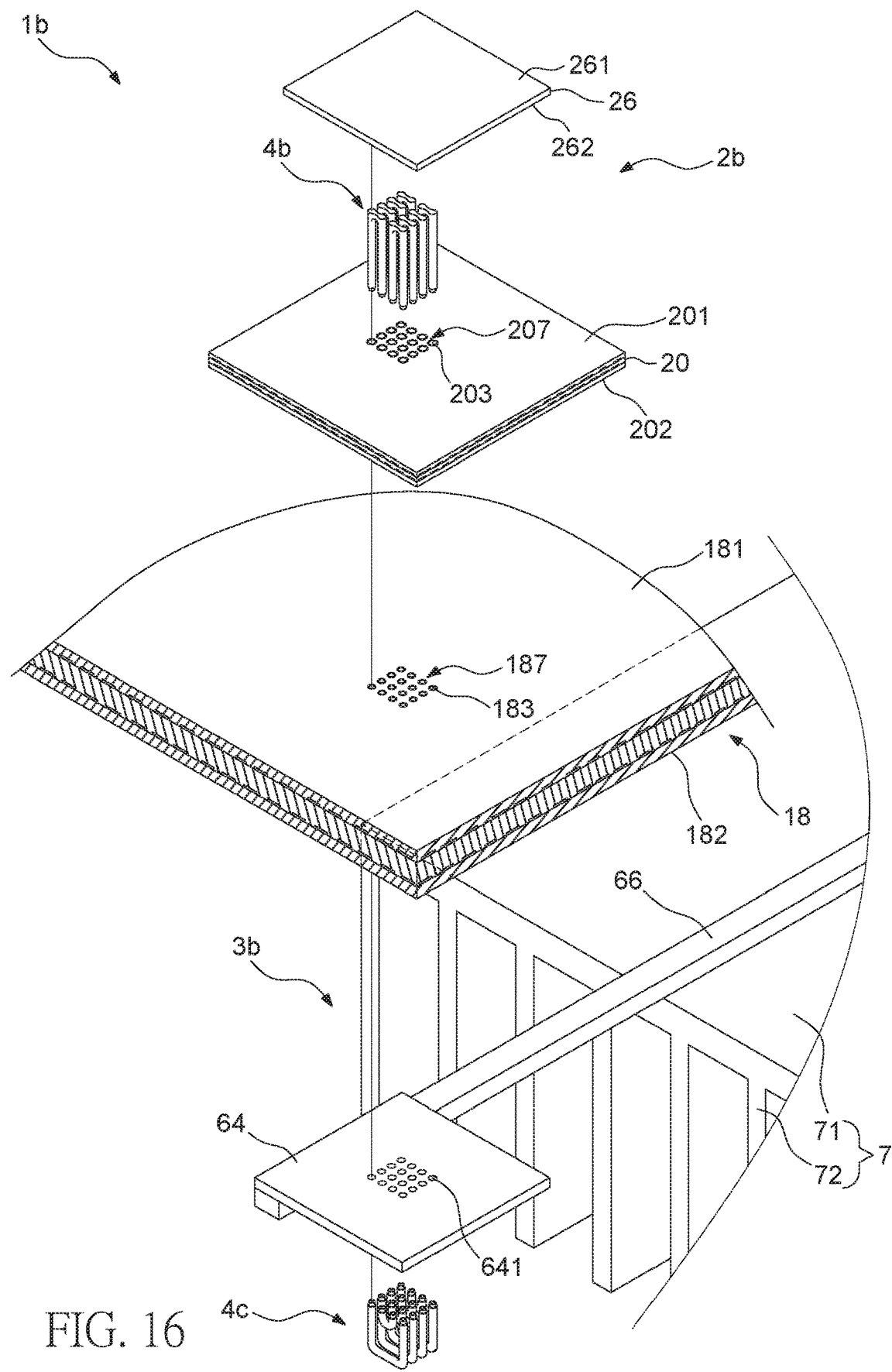
FIG. 16 illustrates an exploded perspective view of an electronic device according to some embodiments of the present disclosure.

FIG. 16 illustrates an exploded perspective view of an electronic device 1b according to some embodiments of the present disclosure. The electronic device 1b is similar to the electronic device 1 of FIG. 1, and the differences are described as follows. The electronic device 1b includes a semiconductor package structure 2b, a plurality of top U-shaped pipes 4b, a main substrate 18, a thermal plate 64, a plurality of bottom U-shaped pipes 4c and a heat dissipating device 3b. The first elastic layer 12, the intermediate block 14 and the second layer 16 of FIG. 1 are omitted.

Figure 17:
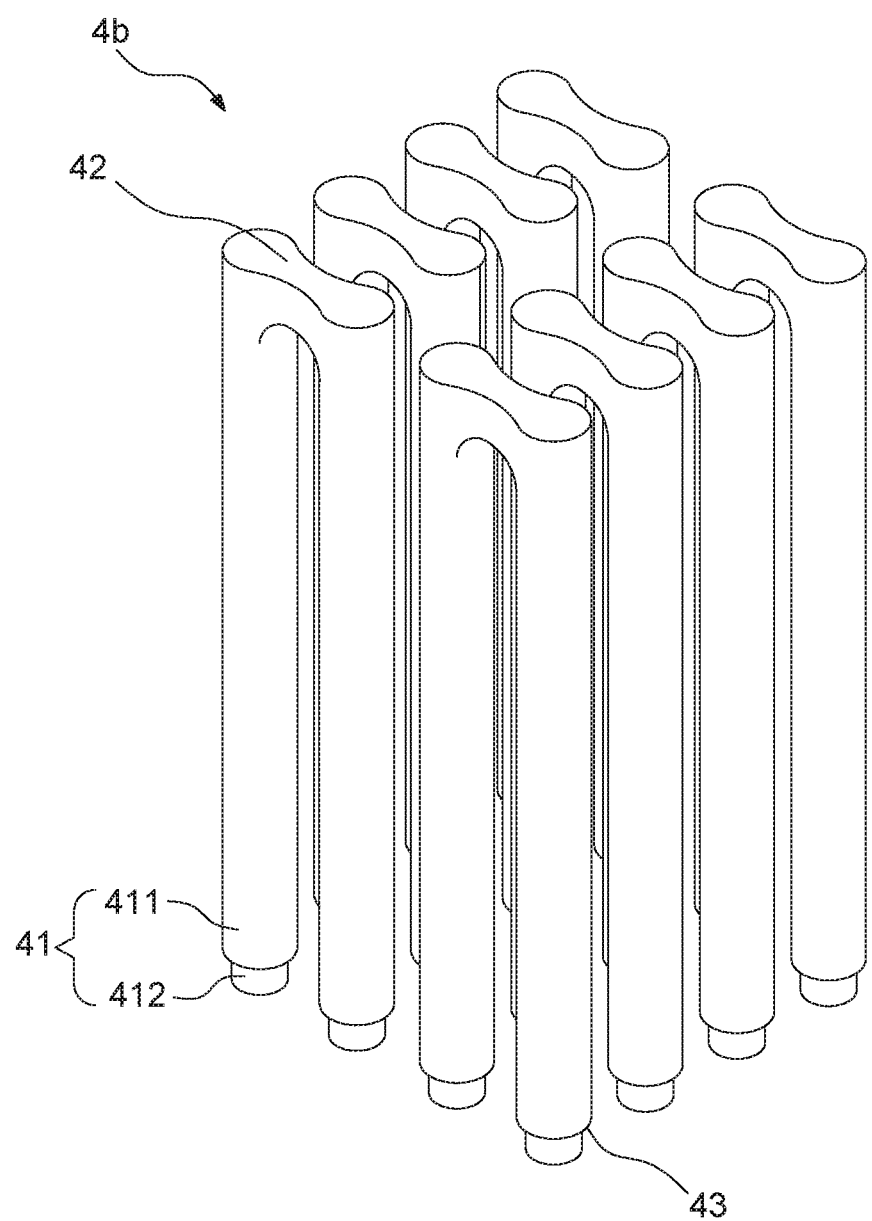
FIG. 17 illustrates a perspective view of top U-shaped pipes of FIG. 16.

FIG. 17 illustrates a perspective view of the top U-shaped pipes 4b of FIG. 16. Each of the top U-shaped pipes 4b includes two ends 41 and a connecting portion 42 connecting the two ends 41. Each of the ends 41 includes a main portion 411 and a joint head portion 412. An outer diameter of the joint head portion 412 is less than an outer diameter of the main portion 411 so as to form a shoulder portion 43. The top surface of the connecting portion 42 may be flat.

Figure 18:
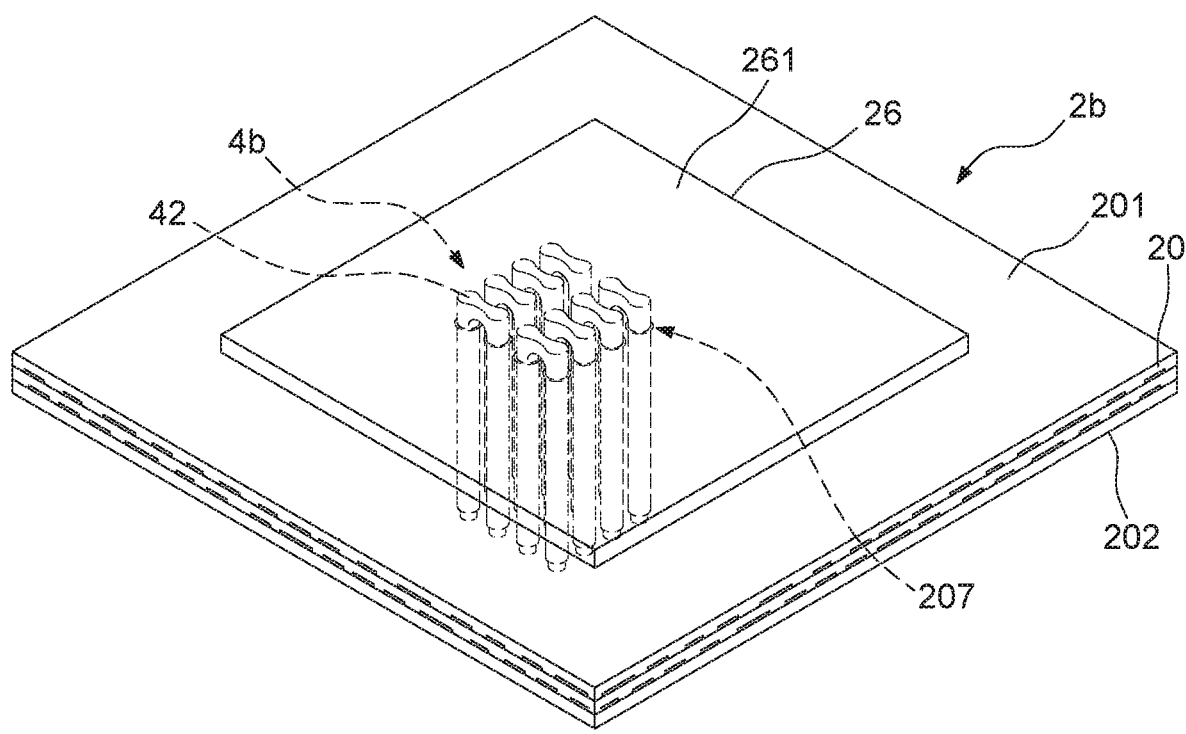
FIG. 18 illustrates a perspective view of a semiconductor package structure of FIG. 16.
Figure 19:
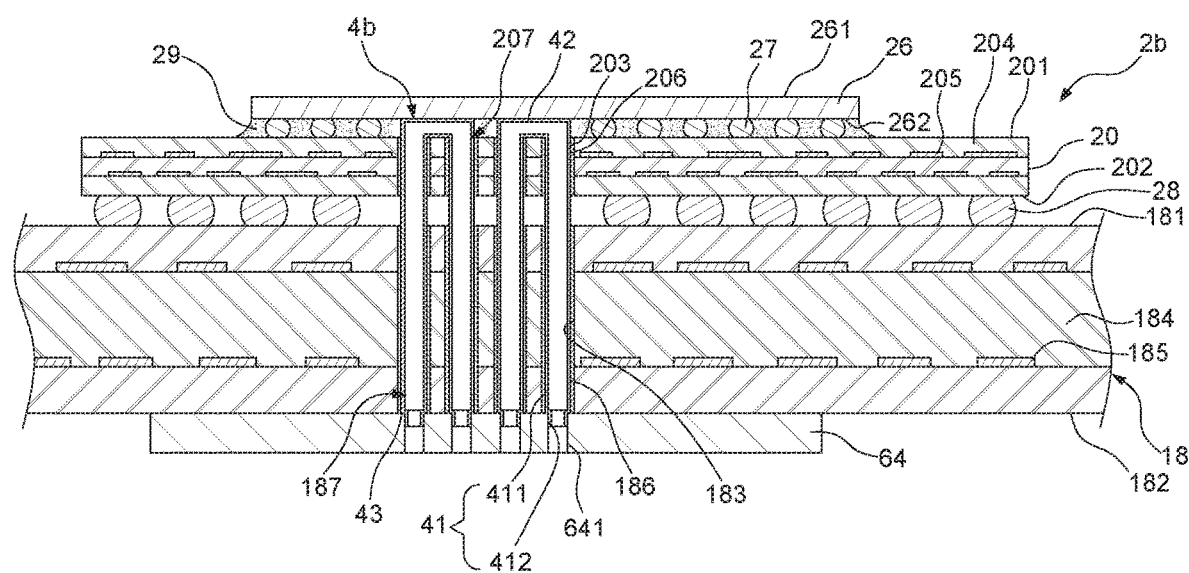
FIG. 19 illustrates a cross-sectional view of an assembly of top U-shaped pipes, a semiconductor package structure, a main substrate and a thermal plate of FIG. 16.

FIG. 18 illustrates a perspective view of a semiconductor package structure 2b of FIG. 16. The semiconductor package structure 2b includes the package substrate 20, the semiconductor die 26, the top U-shaped pipes 4b, a plurality of inner connecting elements 27 (e.g., solder bumps) (FIG. 19) and a plurality of external connecting elements 28 (e.g., solder bumps) (FIG. 19). The ends 41 of the top U-shaped pipes 4b are pressed to pass through (penetrate through) or extend through the first hollow vias 207 of the package substrate 20, and the connecting portion 42 of the top U-shaped pipe 4b may be disposed on the first surface 201 of the package substrate 20. It is noted that the inner layers 206 on the first hollow through holes 203 of the package substrate 20 may be omitted. Thus, the first hollow vias 207 are defined by only the inner surfaces of the first hollow through holes 203. Then, the semiconductor die 26 is attached to the package substrate 20 through the inner connecting elements 27. The second surface 202 of the semiconductor die 26 may contact the top surface of the connecting portion 42 of the top U-shaped pipes 4b directly or through a solder paste. The connecting portion 42 of the top U-shaped pipe 4b is disposed between the package substrate 20 and the semiconductor die 16.

FIG. 19 illustrates a cross-sectional view of an assembly of the top U-shaped pipes 4b, the semiconductor package structure 2b, the main substrate 18 and the thermal plate 64 of FIG. 16. The ends 41 of the top U-shaped pipes 4b further extend through or pass through (penetrate through) the second hollow vias 187 of the main substrate 18 to connect the through holes 641 of the thermal plate 64. It is noted that the inner layers 186 on the second hollow through holes 183 of the main substrate 18 may be omitted. Thus, the second hollow vias 187 are defined by only the inner surfaces of the second hollow through holes 183. In addition, the top surface of the thermal plate 64 may attached to the second surface 182 of the main substrate 18. The joint head portion 412 of the top U-shaped pipe 4b is inserted into the top portion of the through hole 641 of the thermal plate 64 by close fitting, and the shoulder portion 43 of the top U-shaped pipe 4b contacts and sustains the top surface of the thermal plate 64. Thus, the ends 41 of the top U-shaped pipes 4b connect the through holes 641 of the thermal plate 64.

Figure 20:
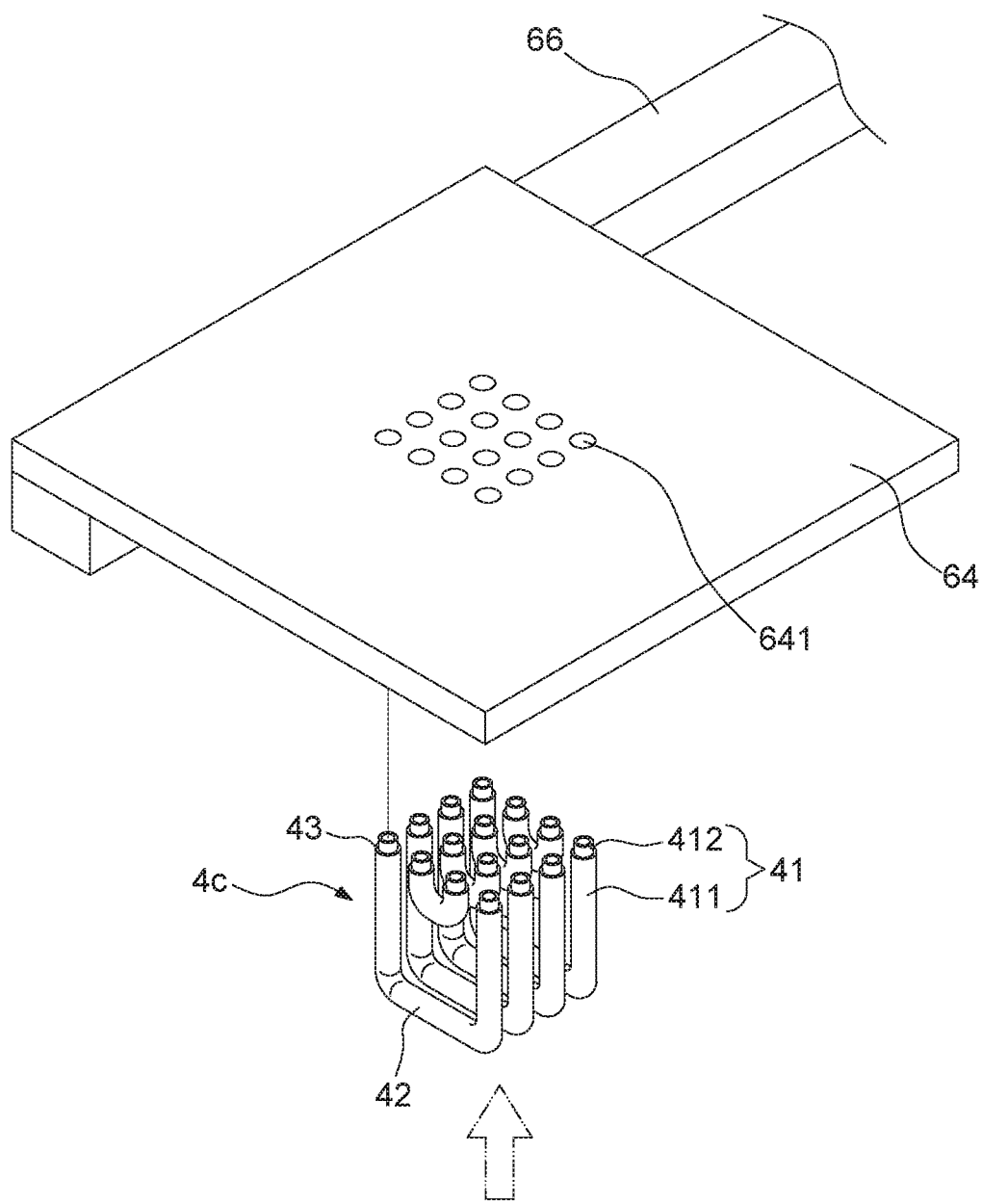
FIG. 20 illustrates an exploded perspective view of a thermal plate and bottom U-shaped pipes of FIG. 16.

FIG. 20 illustrates an exploded perspective view of the thermal plate 64 and the bottom U-shaped pipes 4c of FIG. 16. The thermal plate 64 is disposed under the main substrate 18 and defines a plurality of through holes 641. A material of the thermal plate 64 may be metal such as copper, aluminum, stainless steel, oxygen-free copper or other suitable material. In addition, the bottom U-shaped pipes 4c are disposed under the thermal plate 64. Each of the bottom U-shaped pipes 4c includes two ends 41 and a connecting portion 42 connecting the two ends 41. Each of the ends 41 includes a main portion 411 and a joint head portion 412. An outer diameter of the joint head portion 412 is less than an outer diameter of the main portion 411 so as to form a shoulder portion 43.

Figure 21:
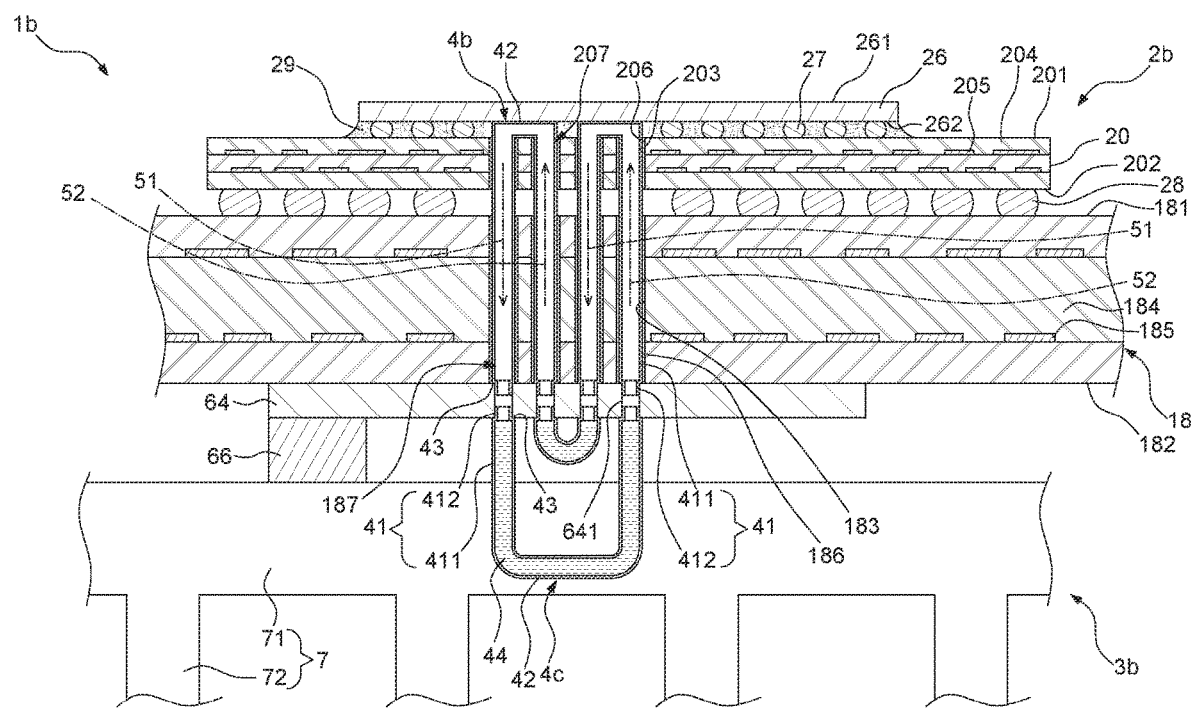
FIG. 21 illustrates a cross-sectional assembly view of an electronic device of FIG. 16.

FIG. 21 illustrates a cross-sectional assembly view of the electronic device 1b of FIG. 16. The joint head portion 412 of the bottom U-shaped pipe 4c is inserted into the bottom portion of the through hole 641 of the thermal plate 64 by close fitting, and the shoulder portion 43 of the bottom U-shaped pipe 4c contacts and sustains the bottom surface of the thermal plate 64. Thus, the ends 41 of the bottom U-shaped pipes 4c connect the through holes 641 of the thermal plate 6, and the bottom U-shaped pipes 4c are communicated with the top U-shaped pipes 4b. Further, the first working fluid 44 is disposed in the bottom U-shaped pipes 4c. In addition, the heat dissipating device 3b includes a heat sink 7 and a heat pipe 66. The heat sink 7 includes a base plate 71 and a plurality of heat dissipating bars 72 disposed on the base plate 71. One end (e.g., a bottom surface) of the heat pipe 66 connects the base plate 71 of the heat sink 7, and the other end (e.g., a top surface) of the heat pipe 66 connects the bottom surface of the thermal plate 64.

As shown in FIG. 21, two top U-shaped pipes 4b, four through holes 641 of the thermal plate 64 and two bottom U-shaped pipes 4c form an enclosed loop. The enclosed loop is an enclosed space for accommodating a first working fluid 44 and is used for a heat dissipating path. In addition, the thermal plate 64 is thermally connected and physically connected to the heat sink 7 through the heat pipe 66. During the operation of the semiconductor die 26, the heat generated by the semiconductor die 26 will be absorbed by the first working fluid 44 in the top U-shaped pipes 4b and the bottom U-shaped pipes 4c so that the first working fluid 44 may become high-temperature fluid or high-temperature vapor. Then, the high-temperature fluid or high-temperature vapor in the top U-shaped pipes 4b and the bottom U-shaped pipes 4c will be cooled by the heat sink 7 to become liquid state. Thus, the circulation of the first working fluid 44 and its vapor forms a loop of thermal convection similar to the thermal convection shown in FIG. 10.

Figure 22:
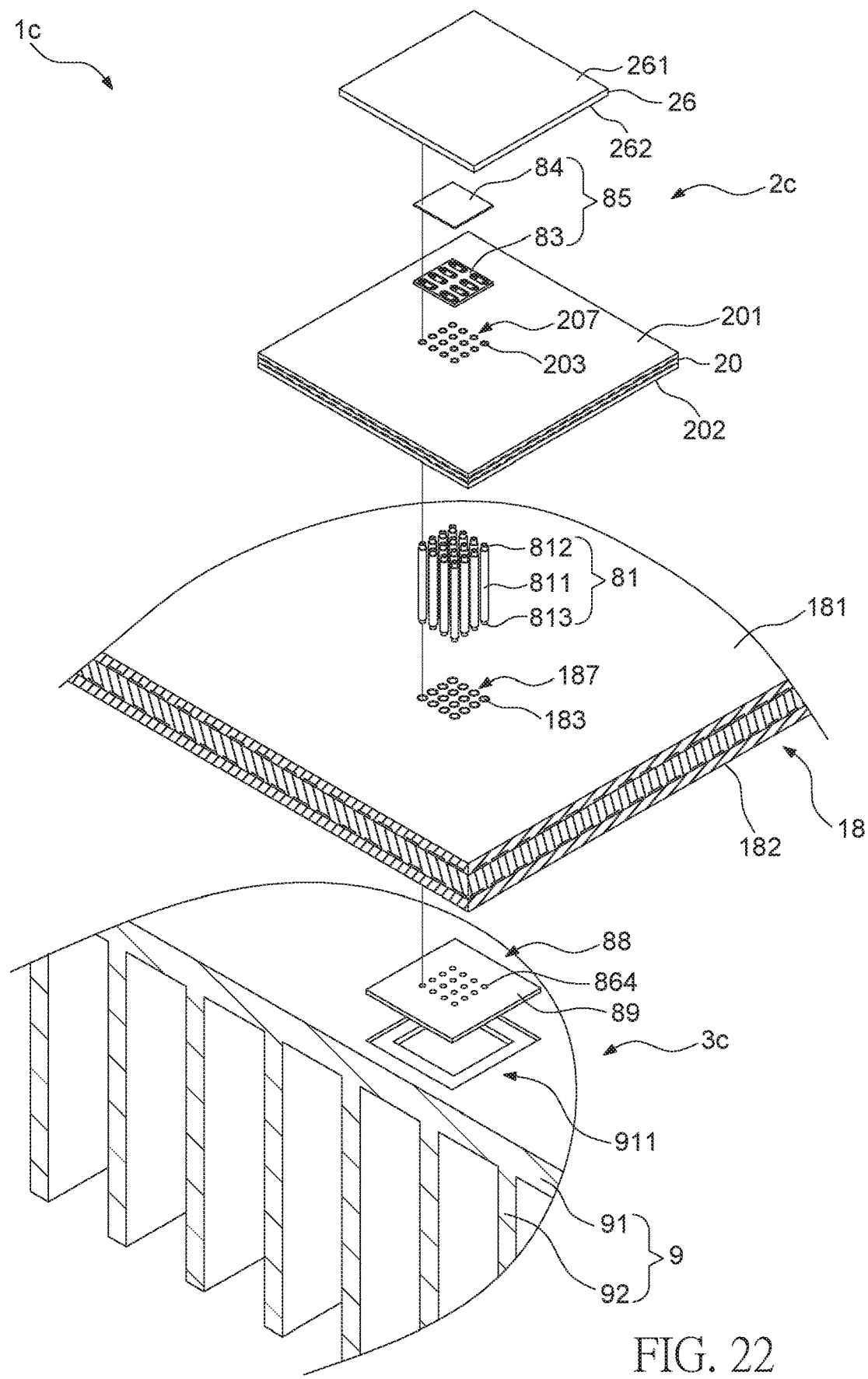
FIG. 22 illustrates an exploded perspective view of an electronic device according to some embodiments of the present disclosure.

FIG. 22 illustrates an exploded perspective view of an electronic device 1c according to some embodiments of the present disclosure. The electronic device 1c is similar to the electronic device 1 of FIG. 1, and the differences are described as follows. The electronic device 1c includes a semiconductor package structure 2c, a top connecting element 85, a main substrate 18, a plurality of straight pipes 81, a bottom connecting element 88 and a heat dissipating device 3c. The first elastic layer 12, the intermediate block 14 and the second layer 16 of FIG. 1 are omitted.

Figure 23:
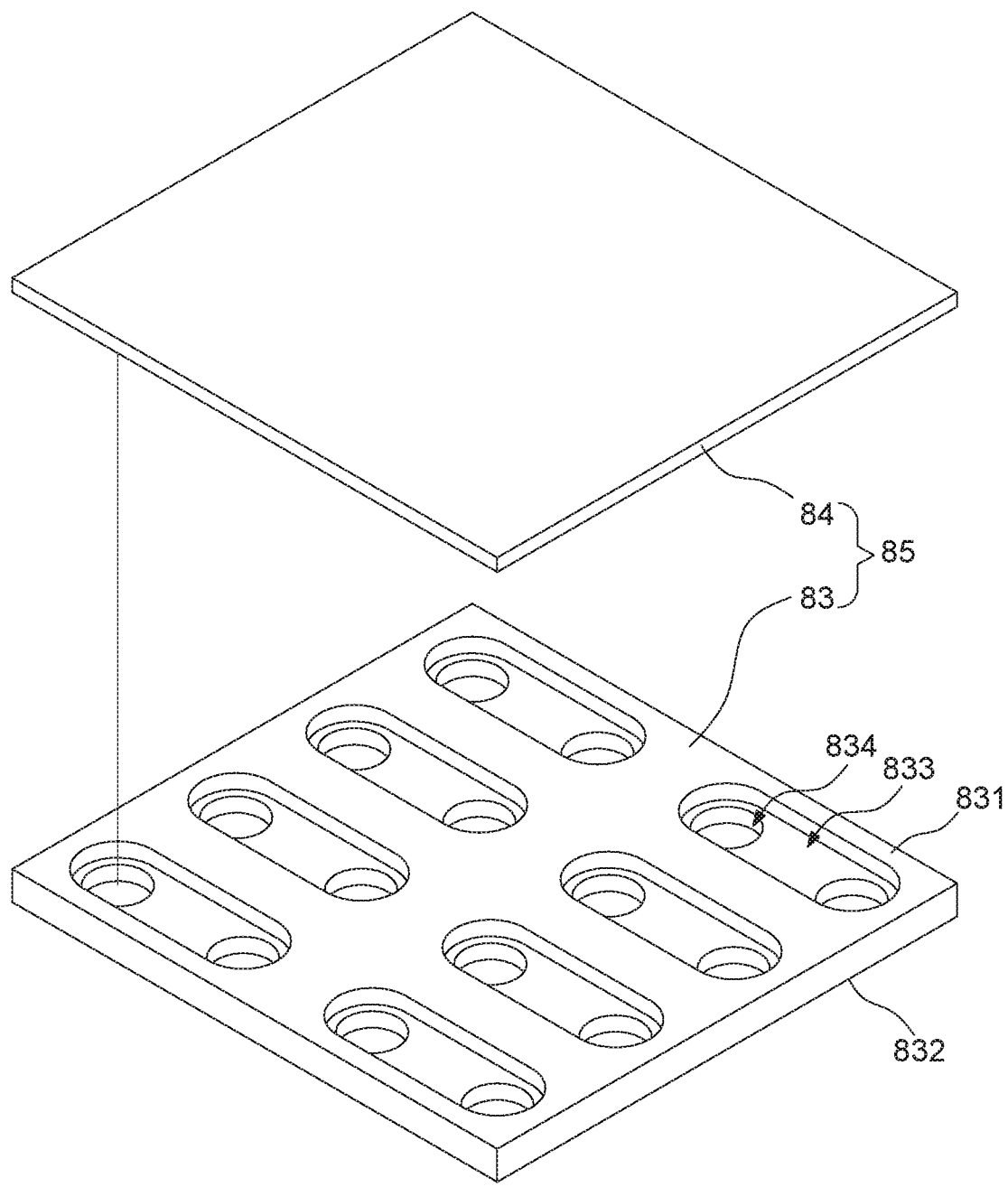
FIG. 23 illustrates an exploded perspective view of a top connecting element of FIG. 22.

FIG. 23 illustrates an exploded perspective view of the top connecting element 85 of FIG. 22. The top connecting element 85 is disposed between the package substrate 20 and the semiconductor die 26, and includes a top base block 83 and a top cover 84. The top base block 83 has a top surface 831 and a bottom surface 832 opposite to the top surface 831. The top base block 83 defines a plurality of top grooves 833 recessed from a top surface 831 of the top base block 83 and a plurality of top holes 834 recessed from a bottom surface 832 of the top base block 83. At least two top holes 834 communicate with one top groove 833, and the top cover 84 covers the top surface 831 of the top base block 83. As shown in FIG. 23, the top groove 833 does not extend through the top base block 83, and a depth of the top groove 833 may be one half of a thickness of the top base block 83. In addition, the top hole 834 may extend through the top base block 83 in the top groove 833. A depth of the top hole 834 may be one half of a thickness of the top base block 83. As shown in FIG. 23, the top base block 83 may define eight top grooves 833 and sixteen top holes 834.

Figure 24:
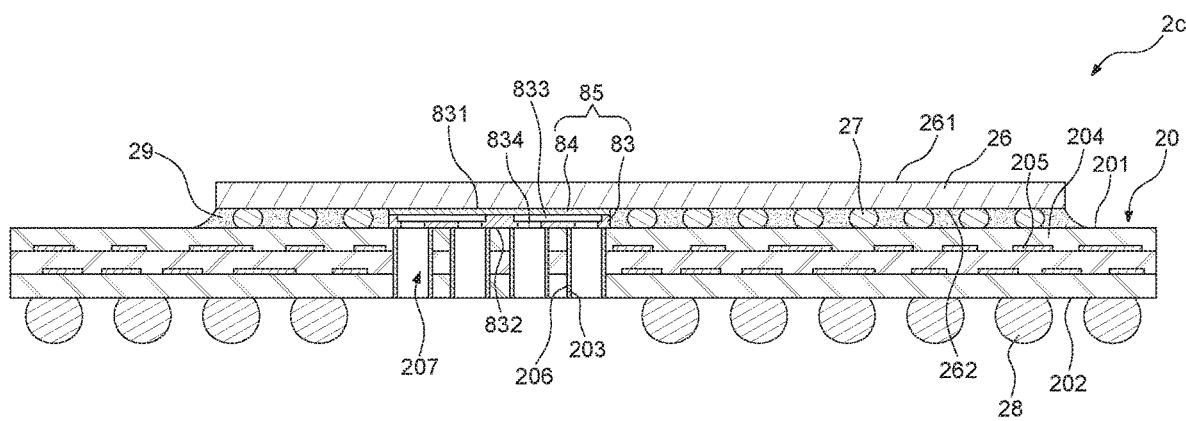
FIG. 24 illustrates a cross-sectional view of a semiconductor package structure of FIG. 22.

FIG. 24 illustrates a cross-sectional view of the semiconductor package structure 2c of FIG. 22. The semiconductor package structure 2c includes the package substrate 20, the top connecting element 85, the semiconductor die 26, the inner connecting elements 27 (e.g., solder bumps) and the external connecting elements 28 (e.g., solder bumps). The top connecting element 85 is attached to the first surface 201 of the package substrate 20 to cover the first hollow vias 207. Thus, each of the first hollow vias 207 is communicated with each of the top hole 834 of the top base block 83, and two of the first hollow vias 207 are communicated with each other through the top groove 833 of the top connecting element 85. It is noted that the inner layers 206 on the first hollow through holes 203 of the package substrate 20 may be omitted. Thus, the first hollow vias 207 are defined by only the inner surfaces of the first hollow through holes 203. In some embodiments, a solder paste may be disposed on the top surface of the top cover 84. The semiconductor die 26 is electrically connected to the first surface 201 of the package substrate 20, and the top connecting element 85 are disposed under the semiconductor die 26. The semiconductor die 26 is electrically connected to the first surface 201 of the package substrate 20 through the inner connecting elements 27 (e.g., solder bumps) by flip chip bonding. After a first reflow process, a height of the inner connecting element 27 may be substantially equal to a height of the top connecting element 85, and the top connecting element 85 may be attached to the second surface 262 of the semiconductor die 26 through the solder paste. However, the top surface of the top cover 84 of the top connecting element 85 may contact the second surface 262 of the semiconductor die 26 directly.

Figure 25:
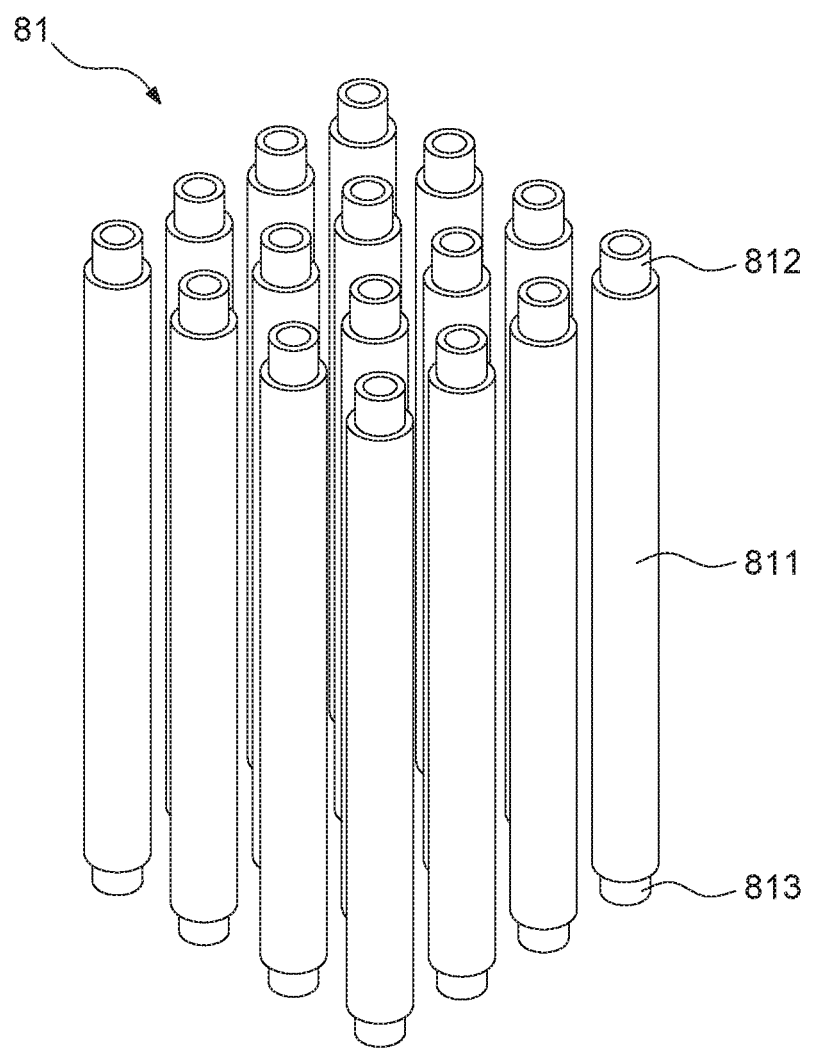
FIG. 25 illustrates a perspective view of straight pipes of FIG. 22.

FIG. 25 illustrates a perspective view of the straight pipes 81 of FIG. 22. Each of the straight pipes 81 includes a main portion 811, a top joint head portion 812 and a bottom joint head portion 813. An outer diameter of the top joint head portion 812 is less than an outer diameter of the main portion 811, and an outer diameter of the bottom joint head portion 813 is less than the outer diameter of the main portion 811.

Figure 26:
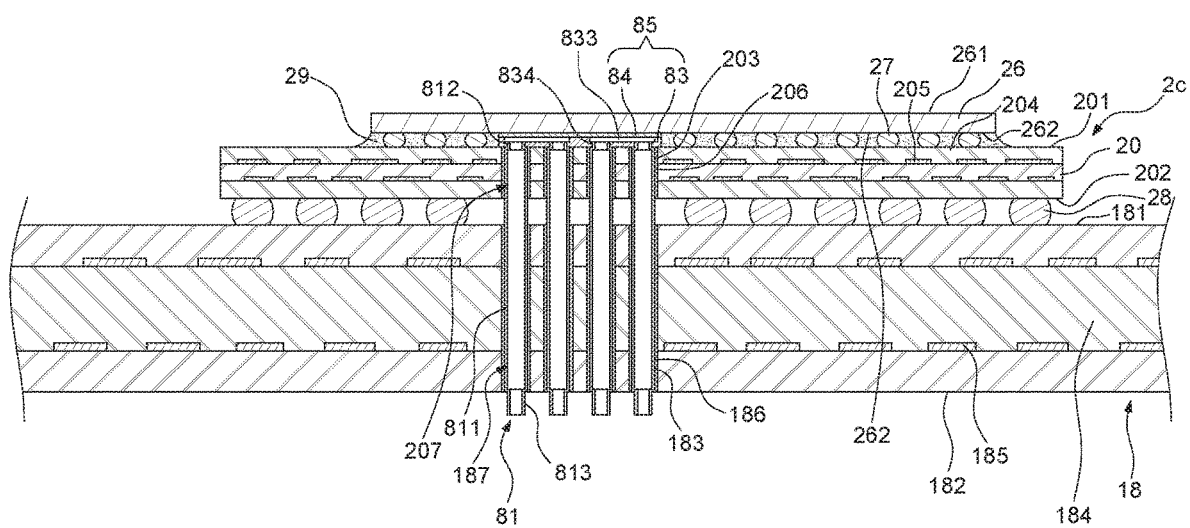
FIG. 26 illustrates a cross-sectional view of an assembly of a main substrate, a semiconductor package structure and straight pipes of FIG. 22.

FIG. 26 illustrates a cross-sectional view of an assembly of the main substrate 18, the semiconductor package structure 2c and the straight pipes 81 of FIG. 22. The semiconductor package structure 2c is electrically connected and physically connected to the main substrate 18 through the external connecting elements 28. The first hollow vias 207 of the package substrate 20 are aligned with the second hollow vias 187 of the main substrate 18. It is noted that the inner layers 186 on the second hollow through holes 183 of the main substrate 18 may be omitted. Thus, the second hollow vias 187 are defined by only the inner surfaces of the second hollow through holes 183. Each of the straight pipes 81 pass through (penetrate through) each of the second hollow vias 187 of the main substrate 18 and the first hollow vias 207 of the package substrate 20. As shown in FIG. 26, the top joint head portion 812 of the straight pipe 81 is inserted into the top hole 834 of the top base block 83 by close fitting. Thus, the top joint head portion 812 of the straight pipe 81 connect the top hole 834 of the top base block 83, and two top joint head portion 812 of the straight pipes 81 are communicated with each other through the top groove 833 of the top connecting element 85.

Figure 27:
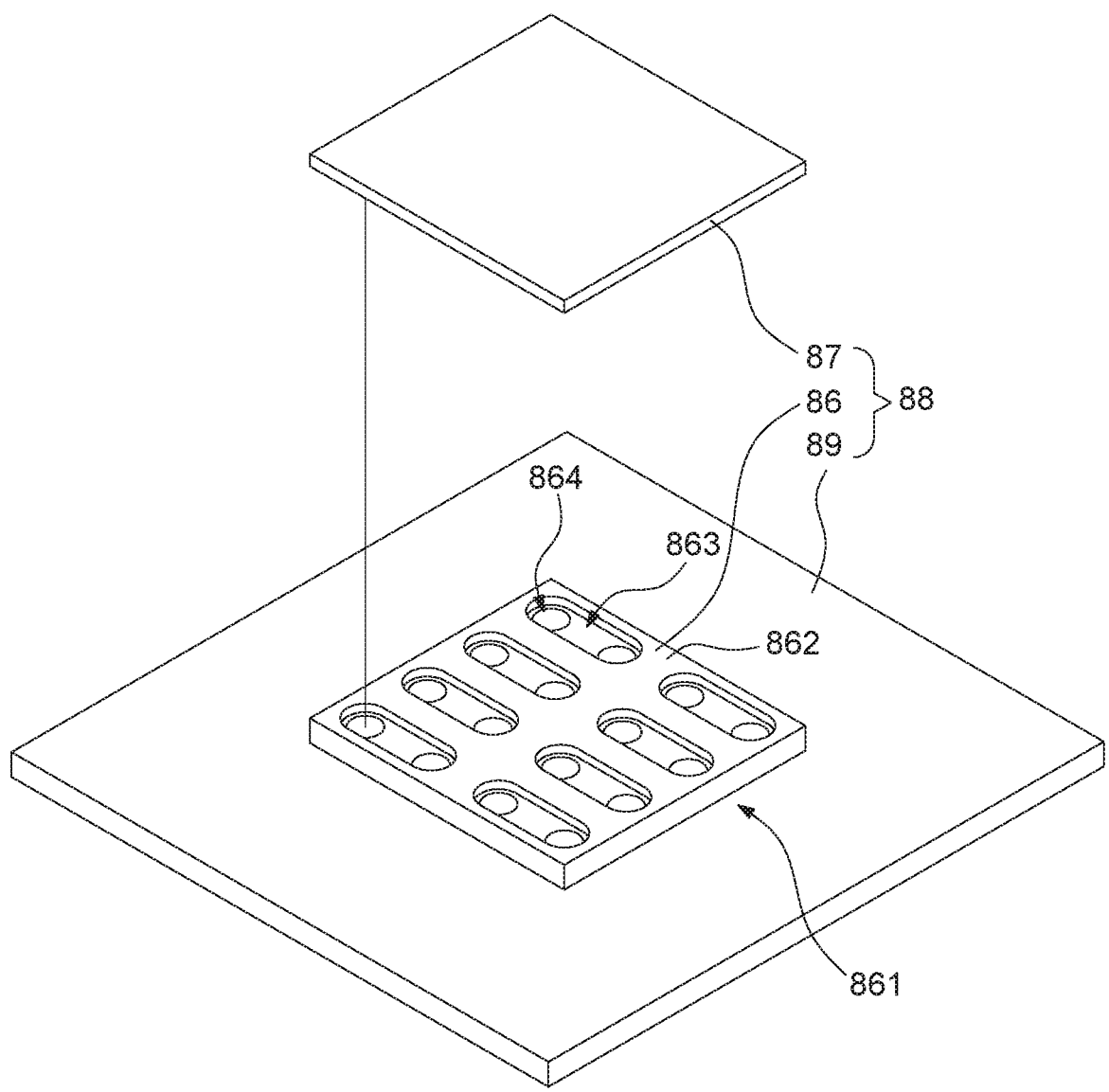
FIG. 27 illustrates a bottom exploded perspective view of a bottom connecting element of FIG. 22.
Figure 28:
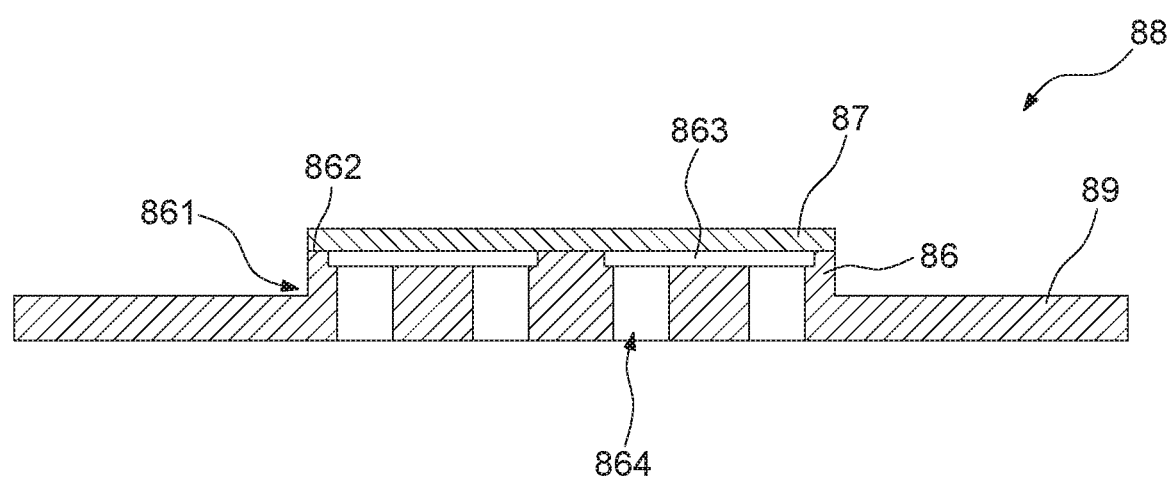
FIG. 28 illustrates a cross-sectional view of an assembly of the bottom connecting element of FIG. 27.

FIG. 27 illustrates a bottom exploded perspective view of the bottom connecting element 88 of FIG. 22. FIG. 28 illustrates a cross-sectional view of the assembly of the bottom connecting element 88 of FIG. 27. The bottom connecting element 88 is disposed under the main substrate 18, and includes a bottom base block 86, a bottom cover 87 and an extending portion 89. The bottom base block 86 has a first side 861 and a second surface 862 opposite to the first side 861, and defines a plurality of bottom grooves 863 recessed from the second surface 862 of the bottom base block 86 and a plurality of bottom holes 864 recessed from a first side of the bottom base block 86. At least two bottom holes 864 communicate with one bottom groove 863, and the bottom cover 87 covers the second surface 862 of the bottom base block 86. As shown in FIG. 27 and FIG. 28, the bottom groove 863 may not extend through the bottom base block 86, and a depth of the bottom groove 863 may be one half of a thickness of the bottom base block 86. In addition, the bottom holes 864 may extend through the bottom base block 86 in the bottom groove 863. A depth of the bottom holes 864 may be one half of a thickness of the bottom base block 86. As shown in FIG. 27, the bottom base block 86 may define eight bottom grooves 863 and sixteen bottom holes 864. The extending portion 89 is attached to the first side 861 of the bottom base block 86. The size of the extending portion 89 is greater than the size of the bottom base block 86. In one embodiment, the extending portion 89 and the bottom base block 86 are formed integrally as a monolithic structure. The bottom holes 864 further extend through the extending portion 89.

Figure 29:
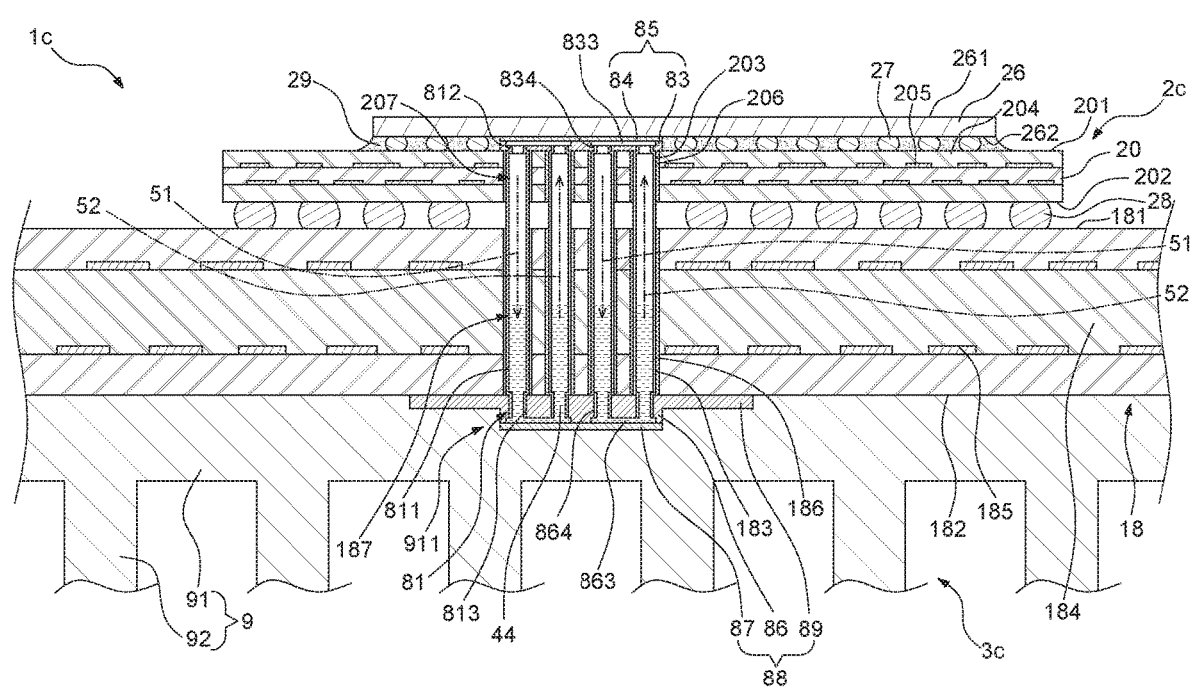
FIG. 29 illustrates a cross-sectional assembly view of the electronic device of FIG. 22.

FIG. 29 illustrates a cross-sectional assembly view of the electronic device 1c of FIG. 22. The bottom joint head portion 813 of the straight pipe 81 is inserted into the bottom hole 864 of the bottom base block 86 by close fitting. Thus, the bottom joint head portion 813 of the straight pipe 81 connect the bottom hole 864 of the bottom base block 86, and two bottom joint head portions 813 of the straight pipes 81 are communicated with each other through the bottom groove 863 of the bottom connecting element 88. Further, the first working fluid 44 is disposed in each of the straight pipes 81 and the bottom groove 863. In addition, the heat dissipating device 3c includes a heat sink 9. The heat sink 9 includes a base plate 91 and a plurality of heat dissipating fins 92 disposed on the base plate 91. The base plate 91 defines a recess portion 911 for accommodating the bottom connecting element 88.

As shown in FIG. 29, two straight pipes 81, one top groove 833 and one bottom groove 863 form an enclosed loop. The enclosed loop is an enclosed space for accommodating the first working fluid 44 and is used for a heat dissipating path. In addition, the bottom connecting element 88 is thermally connected and physically connected to the heat sink 9. During the operation of the semiconductor die 26, the heat generated by the semiconductor die 26 will be absorbed by the first working fluid 44 in the straight pipes 81 so that the first working fluid 44 may become high-temperature fluid or high-temperature vapor. Then, the high-temperature fluid or high-temperature vapor in the straight pipes 81 will be cooled by the heat sink 9 to become liquid state. Thus, the circulation of the first working fluid 44 and its vapor forms a loop of thermal convection similar to the thermal convection shown in FIG. 10.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
a package substrate including a plurality of hollow vias extending through the package substrate;
a semiconductor die electrically connected to the package substrate, wherein the hollow vias are disposed under the semiconductor die; and
a plurality of cap structures disposed between the package substrate and the semiconductor die, wherein each of the cap structures defines a cavity, and each of the cap structures is attached to the package substrate to cover two of the hollow vias, and the two of the hollow vias are communicated with each other through the cavity of the cap structure.

2. The semiconductor package structure of claim 1, wherein a diameter of each of the hollow vias is greater than or equal to 100 μm.

3. The semiconductor package structure of claim 1, wherein the hollow vias are used for a fluid to flow through.

4. The semiconductor package structure of claim 1, wherein the cap structures are attached to the semiconductor die.

5. The semiconductor package structure of claim 1, further comprising a plurality of U-shaped pipes disposed between the package substrate and the semiconductor die, each of the U-shaped pipes includes two ends, the two ends of each of the U-shaped pipes are connected to two of the hollow vias respectively, and the two of the hollow vias are communicated with each other through the U-shaped pipe.

6. The semiconductor package structure of claim 1, wherein the package substrate defines a plurality of through holes, and further includes a plurality of inner layers and at least one circuit layer, wherein the inner layers are disposed on the inner surfaces of the through holes to form the hollow vias, and the circuit layer is electrically insulated from the inner layers.

7. The semiconductor package structure of claim 1, wherein the package substrate defines a plurality of through holes to form the hollow vias.

8. An electronic device, comprising:
a semiconductor package structure, comprising:
a package substrate including a plurality of first hollow vias extending through the package substrate; and
a semiconductor die electrically connected to the package substrate, wherein the first hollow vias are disposed under the semiconductor die;
a main substrate electrically connected to the package substrate, wherein the main substrate includes a plurality of second hollow vias extending through the main substrate, and the second hollow vias are aligned with the first hollow vias; and
a heat dissipating device used for dissipating a heat generated by the semiconductor die, wherein the heat is transmitted through the second hollow vias and the first hollow vias.

9. The electronic device of claim 8, further comprising:
a plurality of cap structures disposed between the package substrate and the semiconductor die, wherein each of the cap structures defines a cavity, each of the cap structures is attached to the package substrate to cover two of the hollow vias, and the two of the first hollow vias are communicated with each other through the cavity of the cap structure;
an intermediate block disposed between the package substrate and the main substrate, wherein the intermediate block defines a plurality of through holes aligned with the second hollow vias and the first hollow vias;
a plurality of U-shaped pipes disposed under the main substrate, each of the U-shaped pipes includes two ends, the two ends of each of the U-shaped pipes are connected to two of the second hollow vias respectively, and the two of the second hollow vias are communicated with each other through the U-shaped pipe, wherein the U-shaped pipes are thermally connected to the heat dissipating device; and
a first working fluid disposed in the U-shaped pipes.

10. The electronic device of claim 9, wherein the heat dissipating device includes a condenser structure, a first channel, a second channel and a second working fluid, the condenser structure defines an enclosed chamber, a portion of each of the U-shaped pipes is disposed in the enclosed chamber of the condenser structure, the first channel and the second channel are communicated with the enclosed chamber of the condenser structure, and the second working fluid flows in the first channel, the enclosed chamber and the second channel and contacts the portion of each of the U-shaped pipes in the enclosed chamber.

11. The electronic device of claim 8, further comprising:
a plurality of cap structures disposed between the package substrate and the semiconductor die, wherein each of the cap structures defines a cavity, each of the cap structures is attached to the package substrate to cover two of the hollow vias, and the two of the first hollow vias are communicated with each other through the cavity of the cap structure;
an intermediate block disposed between the package substrate and the main substrate, wherein the intermediate block defines a plurality of through holes aligned with the second hollow vias and the first hollow vias;
a plurality of U-shaped pipes disposed under the main substrate, wherein each of the U-shaped pipes includes two ends, the two ends of each of the U-shaped pipes are connected to the intermediate block through the second hollow vias, the first hollow vias are communicated with the U-shaped pipes, wherein the U-shaped pipes are thermally connected to the heat dissipating device; and
a first working fluid disposed in the U-shaped pipes.

12. The electronic device of claim 11, wherein the heat dissipating device includes a heat sink and a thermally conductive adhesive material, a portion of each of the U-shaped pipes is connected to the heat sink through the thermally conductive adhesive material.

13. The electronic device of claim 12, wherein the heat sink includes a base plate and a plurality of heat dissipating fins disposed on the base plate, the base plate defines an opening, and the portions of the U-shaped pipes and the thermally conductive adhesive material are disposed in the opening of the base plate.

14. The electronic device of claim 8, further comprising:
a thermal plate disposed under the main substrate, and defining a plurality of through hole;
a plurality of top U-shaped pipes, wherein each of the top U-shaped pipes includes two ends and a connecting portion connecting the two ends, the ends of the top U-shaped pipes extend through the first hollow vias of the package substrate and the second hollow vias of the main substrate to connect the through hole of the thermal plate, and the connecting portion of the top U-shaped pipe is disposed between the package substrate and the semiconductor die;
a plurality of bottom U-shaped pipes disposed under the thermal plate, wherein each of the bottom U-shaped pipes includes two ends and a connecting portion connecting the two ends, the ends of the bottom U-shaped pipes connect the through hole of the thermal plate, and the bottom U-shaped pipes are communicated with the top U-shaped pipes; and
a first working fluid disposed in the bottom U-shaped pipes.

15. The electronic device of claim 14, wherein the heat dissipating device includes a heat sink and a heat pipe, the heat pipe connects the heat sink and the thermal plate.

16. The electronic device of claim 15, wherein the heat sink includes a base plate and a plurality of heat dissipating bars disposed on the base plate, the heat pipe connects the base plate of the heat sink.

17. The electronic device of claim 8, further comprising:
a plurality of straight pipes, wherein each of the straight pipes includes a main portion, a top joint head portion and a bottom joint head portion, two top joint head portions of the straight pipes are communicated with each other through a top connecting element, and two bottom joint head portions of the straight pipes are communicated with each other through a bottom connecting element, the straight pipes extend through the first hollow vias of the package substrate and the second hollow vias of the main substrate, wherein the bottom connecting element is thermally connected to the heat dissipating device; and
a first working fluid disposed in the straight pipes.

18. The electronic device of claim 17, wherein the top connecting element is disposed between the package substrate and the semiconductor die, and includes a top base block and a top cover, the top base block defines a plurality of top grooves recessed from a top surface of the top base block and a plurality of top holes recessed from a bottom surface of the top base block, at least two top holes communicate with one top groove, the top cover covers the top surface of the top base block, and the top joint head portions of the straight pipes connect the top holes of the top base block; the bottom connecting element is disposed under the main substrate, and includes a bottom base block and a bottom cover, the bottom base block defines a plurality of bottom grooves recessed from a bottom surface of the bottom base block and a plurality of bottom holes recessed from a top side of the bottom base block, at least two bottom holes communicate with one bottom groove, the bottom cover covers the bottom surface of the bottom base block, and the bottom joint head portions of the straight pipes connect the bottom holes of the bottom base block.

19. The electronic device of claim 18, wherein the heat dissipating device includes a heat sink, the heat sink includes a base plate and a plurality of heat dissipating fins disposed on the base plate, the base plate defines a recess portion for accommodating the bottom connecting element.

* * * * *